United States Patent
Shiode

(10) Patent No.: US 11,400,619 B2
(45) Date of Patent: Aug. 2, 2022

(54) IMPRINT METHOD AND ARTICLE MANUFACTURING METHOD

(71) Applicant: CANON KABUSHIKI KAISHA, Tokyo (JP)

(72) Inventor: Yoshihiro Shiode, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 148 days.

(21) Appl. No.: 16/564,421

(22) Filed: Sep. 9, 2019

(65) Prior Publication Data

US 2020/0078989 A1 Mar. 12, 2020

(30) Foreign Application Priority Data

Sep. 10, 2018 (JP) .............................. JP2018-169118
Aug. 29, 2019 (JP) .............................. JP2019-156738

(51) Int. Cl.
 *B29C 31/04* (2006.01)
 *B29C 33/00* (2006.01)
 (Continued)

(52) U.S. Cl.
 CPC .......... *B29C 31/04* (2013.01); *B29C 33/0061* (2013.01); *B29C 33/424* (2013.01); *B29C 43/58* (2013.01); *B29C 59/002* (2013.01); *B29C 2043/5825* (2013.01); *B29C 2043/5875* (2013.01)

(58) Field of Classification Search
 None
 See application file for complete search history.

(56) References Cited

U.S. PATENT DOCUMENTS

| 8,556,616 B2 | 10/2013 | Resnick |
| 10,168,615 B2 | 1/2019 | Yamashita |

(Continued)

FOREIGN PATENT DOCUMENTS

| JP | 2009536591 A | 10/2009 |
| JP | 2011228619 A | 11/2011 |

(Continued)

OTHER PUBLICATIONS

Extended European Search Report issued in European Application No. 19195850.3 dated Feb. 10, 2020.

(Continued)

*Primary Examiner* — Jacob T Minskey
*Assistant Examiner* — Adrien J Bernard
(74) *Attorney, Agent, or Firm* — Rossi, Kimms & McDowell LLP

(57) ABSTRACT

An imprint method includes arranging imprint material as droplets on shot region of substrate, bringing the imprint material on part of the shot region into contact with pattern region of mold and then enlarging contact region between the imprint material and the pattern region to whole region of the shot region, and curing the imprint material. in the arranging, in each of local regions located in radial direction from the part of the shot region, the imprint material is arranged such that directional drop density of the imprint material on line parallel to direction orthogonal to the radial direction and with droplets of the imprint material present thereon is smaller than that of the imprint material on line parallel to the radial direction and with droplets of the imprint material present thereon.

21 Claims, 20 Drawing Sheets

(51) Int. Cl.
 *B29C 33/42* (2006.01)
 *B29C 43/58* (2006.01)
 *B29C 59/00* (2006.01)

(56) References Cited

U.S. PATENT DOCUMENTS

| | | |
|---|---|---|
| 10,180,623 B2 | 1/2019 | Wakamatsu |
| 2011/0171340 A1 | 7/2011 | Resnick |
| 2015/0014876 A1 | 1/2015 | Yamashita |

FOREIGN PATENT DOCUMENTS

| | | |
|---|---|---|
| JP | 2015018982 A | 1/2015 |
| JP | 2016157845 A | 9/2016 |
| TW | I388934 B | 3/2013 |
| WO | 2007132320 A2 | 11/2007 |

OTHER PUBLICATIONS

Office Action issued in Taiwanese Appln. No. 108132195 dated Oct. 5, 2021. English translation provided.

FIG. 1
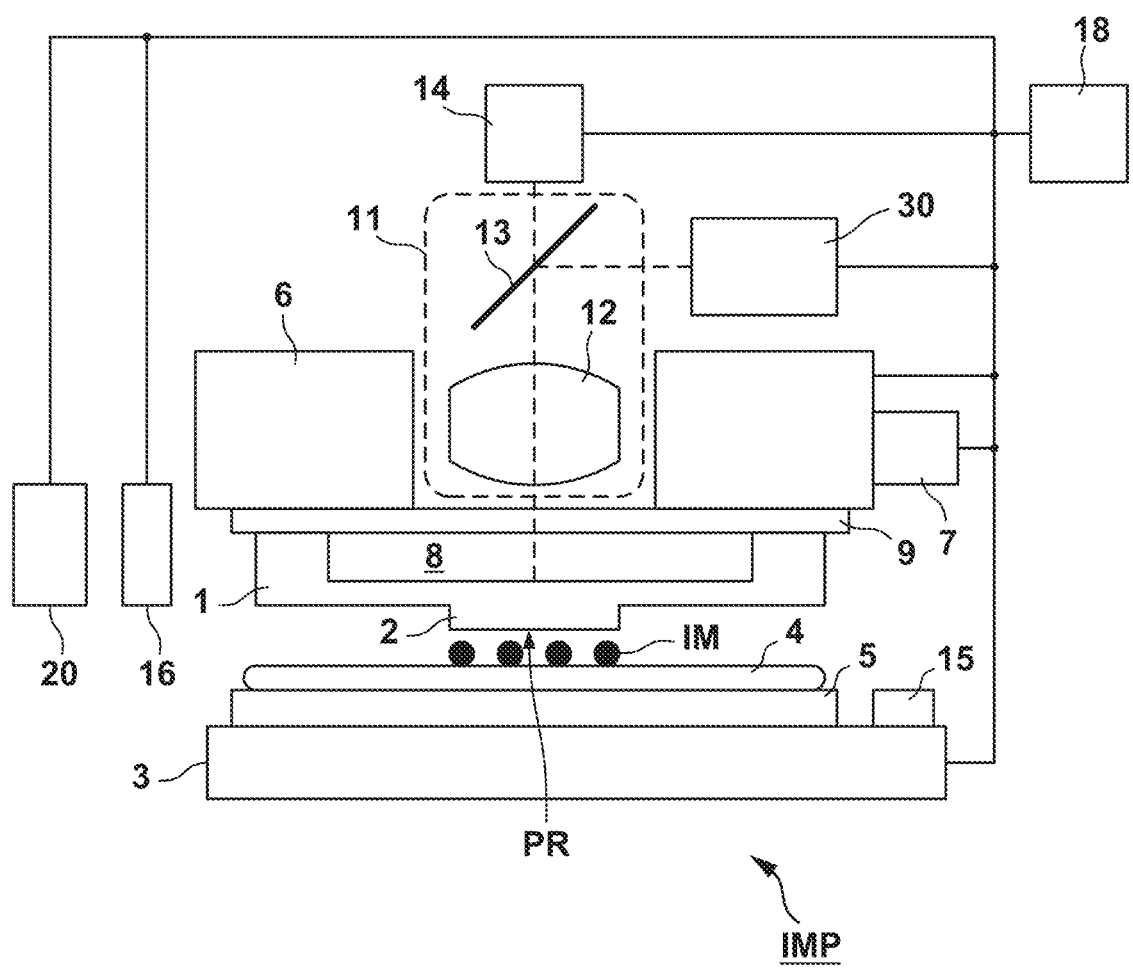
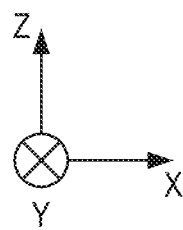

FIG. 2
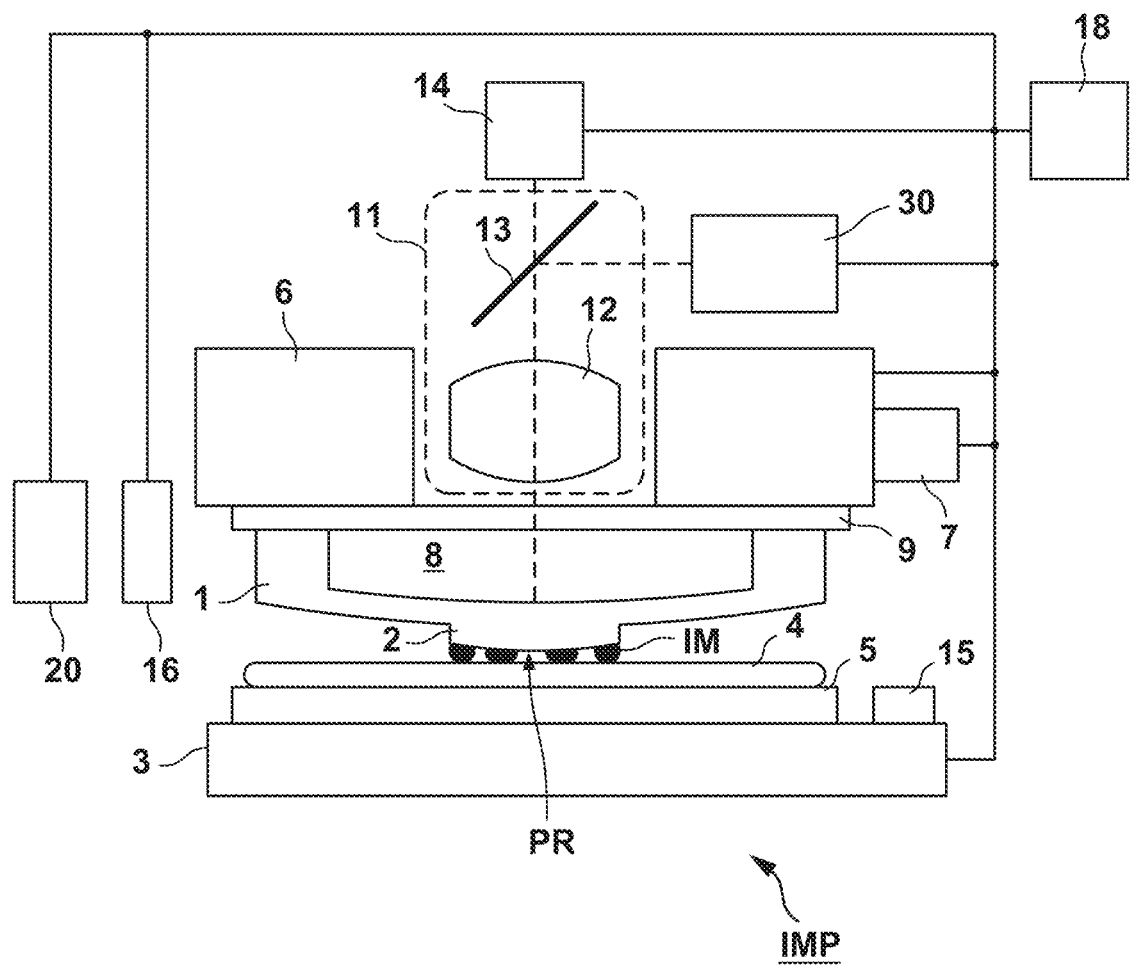
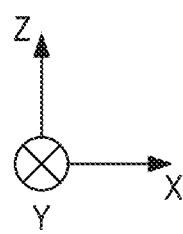

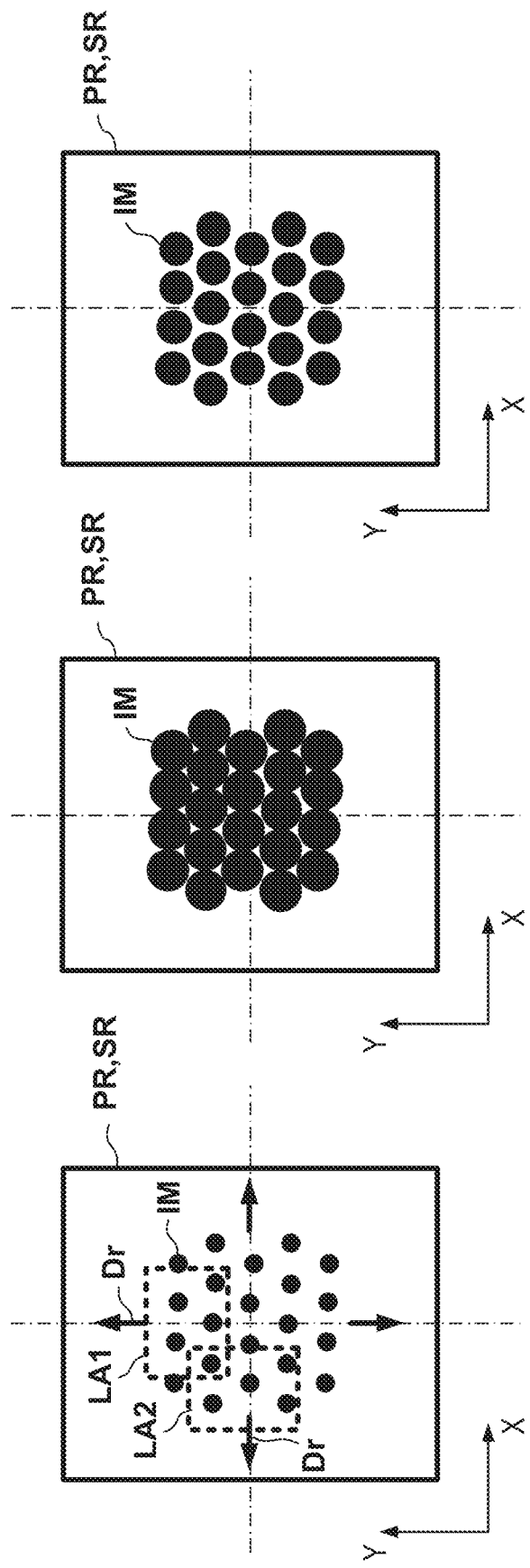

IMPRINT METHOD AND ARTICLE MANUFACTURING METHOD

BACKGROUND OF THE INVENTION

Field of the Invention

The present invention relates to an imprint method and an article manufacturing method.

Description of the Related Art

An imprint technique brings an imprint material on a substrate into contact with a mold, fills the imprint material into a concave portion forming a pattern of the mold, and then cures the imprint material to transfer the pattern of the mold to the substrate. Japanese Patent Laid-Open No. 2009-536591 describes that after a mold is deformed into a convex shape toward a substrate and the central portion of the mold is brought into contact with a polymer material (imprint material) on the substrate, the contact region between the polymer material and the mold is enlarged. In the process of enlarging the contact region between the polymer material and the mold, a gas present between the substrate and the mold is discharged.

In the process of enlarging the contact region between the imprint material on the substrate and the mold, if a gas is trapped in a space surrounded by the substrate, the mold, and the imprint material, the filling of the imprint material into the concave portion of the mold is impaired. If the imprint material is cured in a state in which the filling of the imprint material into the concave portion of the mold is incomplete, a defect can occur in the pattern formed by the cured product of the imprint material. Accordingly, it is necessary to wait for the start of the curing of the imprint material until the gas trapped in the space disappears by being dissolved or condensed in the imprint material and the concave portion of the mold is filled with the imprint material. Such a process can degrade throughput. Entrapment of the gas can occur when the passage through which the gas is discharged is blocked by the imprint material. Therefore, it is important how to arrange droplets of the imprint material on the substrate.

SUMMARY OF THE INVENTION

The present invention provides an imprint method that is advantageous in improving throughput.

One of aspects of the present invention provides an imprint method comprising arranging an imprint material in a form of droplets on a shot region of a substrate, bringing the imprint material on a part of the shot region into contact with a pattern region of a mold and then enlarging a contact region between the imprint material and the pattern region to a whole region of the shot region, and curing the imprint material after the bringing, wherein in the arranging, in each of a plurality of local regions located in a radial direction from the part of the shot region, the imprint material is arranged such that a directional drop density of the imprint material on a line parallel to a direction orthogonal to the radial direction and with a plurality of droplets of the imprint material present thereon is smaller than a directional drop density of the imprint material on a line parallel to the radial direction and with a plurality of droplets of the imprint material present thereon.

Further features of the present invention will become apparent from the following description of exemplary embodiments with reference to the attached drawings.

BRIEF DESCRIPTION OF THE DRAWINGS

FIG. 1 is a view showing the arrangement of an imprint apparatus of an embodiment of the present invention;

FIG. 2 is a view showing the arrangement of the imprint apparatus of the embodiment of the present invention;

FIGS. 7A to 7C are views illustrating the arrangement of droplets of the imprint material with respect to the shot region and the droplets in the contact step;

DESCRIPTION OF THE EMBODIMENTS

Figure 3:
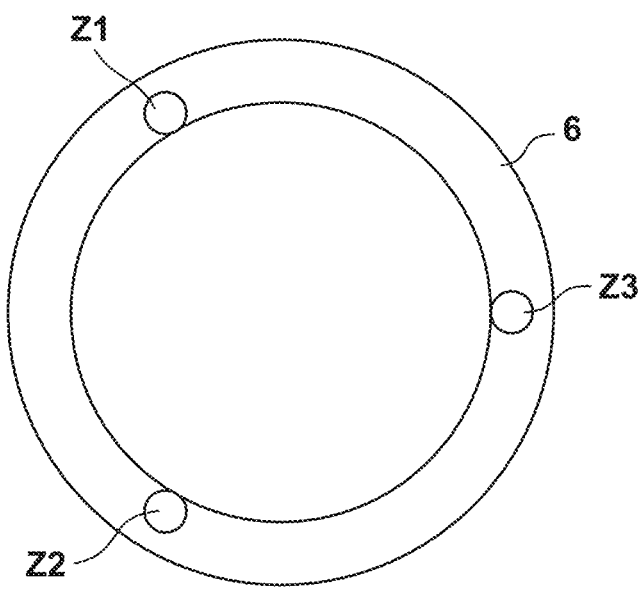
FIG. 3 is a view illustrating the arrangement of a mold driver (X-Y stage)

Exemplary embodiments of the present invention will be described below with reference to the accompanying drawings.

FIGS. 1 and 2 show the arrangement of an imprint apparatus IMP of an embodiment of the present invention. The imprint apparatus IMP executes an imprint method of forming a pattern made of a cured product of an imprint material IM on the shot region of a substrate 4. The imprint method can include an arrangement step, a contact step performed after the arrangement step, and a curing step performed after the contact step. The imprint method can further include a separation step performed after the curing step. In the arrangement step, the imprint material IM is arranged in the form of droplets (drops) on the shot region of the substrate 4. In the contact step that can be performed after the arrangement step, the imprint material IM on a part of the shot region of the substrate 4 is brought into contact with a pattern region PR of a mold 1, and then the contact region between the imprint material IM and the pattern region PR is enlarged to the whole region of the shot region. In the curing step that can be performed after the contact step, the imprint material IM is cured. In the separation step that can be performed after the curing step, the cured product of the imprint material IM and the mold 1 are separated from each other.

As an imprint material, a curable composition (to be also referred to as a resin in an uncured state) to be cured by receiving curing energy is used. Examples of the curing energy are an electromagnetic wave, heat, and the like. The electromagnetic wave is, for example, light selected from the wavelength range of 10 nm (inclusive) to 1 mm (inclusive). Examples of the electromagnetic wave can be infrared light, a visible light beam, and ultraviolet light. The curable composition can be a composition cured with light irradiation or heating. Among these compositions, the photocurable composition cured by light irradiation contains at least a polymerizable composition and a photopolymerization initiator, and may further contain a nonpolymerizable compound or a solvent, as needed. The nonpolymerizable compound is at least one material selected from the group consisting of a sensitizer, a hydrogen donor, an internal mold release agent, a surfactant, an antioxidant, and a polymer component. The viscosity (the viscosity at 25° C.) of the imprint material is, for example, 1 mPa·s (inclusive) to 100 mPa·s (inclusive). Examples of the substrate material can be glass, a ceramic, a metal, a semiconductor, a resin, and the like. A member made of a material different from the substrate may be formed on the surface of the substrate, as needed. Examples of the substrate are a silicon wafer, a compound semiconductor wafer, and silica glass.

In the specification and the accompanying drawings, directions will be indicated by an XYZ coordinate system in which directions parallel to the surface of the substrate 4 are set as the X-Y plane. Assume that directions parallel to the X-axis, the Y-axis, and the Z-axis of the XYZ coordinate system are the X direction, the Y direction, and the Z direction, respectively. Assume that a rotation about the X-axis, a rotation about the Y-axis, and a rotation about the Z-axis are θX, θY, and θZ, respectively. Control operations or driving operations related to the X-axis, the Y-axis, and the Z-axis represent control operations or driving operations related to a direction parallel to the X-axis, a direction parallel to the Y-axis, and a direction parallel to the Z-axis, respectively. In addition, control operations or driving operations related to the θX-axis, the θY-axis, and the θZ-axis indicate control operations or driving operations related to a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z-axes, and an orientation is information that can be specified by values on the θX-, θY-, and θZ-axes. Positioning indicates control of the position and/or orientation. Alignment can include control of the position and/or orientation of at least one of the substrate and the mold. Alignment can also include control for correcting or changing the shape of at least one of the substrate and the mold.

The imprint apparatus IMP can include a substrate holder 5 that holds the substrate 4 and a substrate driver (X-Y stage) 3 that drives the substrate 4 by driving the substrate holder 5. In addition, the imprint apparatus IMP can include a mold holder 9 that holds the mold 1 and a mold driver (X-Y stage) 6 that drives the mold 1 by driving the mold holder 9. As illustrated in FIG. 3, the mold driver 6 can include three drive systems Z1, Z2, and Z3 that drive the mold holder 9 in the Z direction. The drive systems Z1, Z2 and Z3 include, for example, sensors that detect the position in the Z-axis direction and the force acting in the Z direction, and the position and orientation of the mold 1 and the force applied to the mold 1 can be controlled based on the outputs of these sensors.

The substrate driver 3 and the mold driver 6 constitute a drive mechanism for driving at least one of the substrate 4 and the mold 1 so as to adjust the relative position between the substrate 4 and the mold 1. The adjustment of the relative position by the drive mechanism includes a driving operation for bringing the pattern region PR of the mold 1 into contact with the imprint material on the substrate 4 and separating the mold 1 from the cured product of the imprint material. The substrate driver 3 can be configured to drive the substrate 4 in a plurality of axes (for example, three axes of the X-, Y-, and θZ-axes, and preferably six axes of the X-, Y-, Z-, θX-, θY-, and θZ-axes). The mold driver 6 can be configured to drive the mold 1 in a plurality of axes (for example, three axes of the Z-, θX-, and θY-axes, and preferably six axes of the X-, Y-, Z-, θX-, θY-, and θZ-axes).

The imprint apparatus IMP can include a curing device 30 that cures the imprint material IM by applying curing energy to the imprint material IM, and an image capturing device 14 capable of capturing (observing) a visual field including the pattern region PR. Using the image capturing device 14, it is possible to capture (observe), for example, how the contact region between the imprint material IM and the pattern region PR is enlarged in the contact step, and an interference fringe formed by the gap between the substrate 4 and the pattern region PR. The image capturing device 14 can capture the visual field including the pattern region PR via an optical system 11. The curing device 30 can be configured to provide curing energy to the imprint material IM on the shot region of the substrate 1 via the optical system 11. The optical system 11 can include, for example, a relay optical system 12 and a mirror 13. In addition, the imprint apparatus IMP can include an alignment detection system (not shown) that detects the relative position between the shot region of the substrate 4 and the pattern region PR of the mold 1.

The mold 1 includes the first side and the second side. A mesa portion 2 protruding more than the peripheral portion is provided on the first side, and the pattern region PR is provided on the surface of the mesa portion 2. A cavity 8 is provided on the second side. By applying a pressure (force) to the cavity 8, the mesa portion 2 and the pattern region PR can be deformed in the Z direction. The deformation of the mesa portion 2 and the pattern region PR in the Z direction can include making the mesa portion 2 and the pattern region PR convex toward the substrate 4 or planar.

The imprint apparatus IMP can include a deformation device 7 that controls the deformation of the mesa portion 2 and the pattern region PR in the Z direction by controlling the pressure to the cavity 8. The imprint apparatus IMP may also include a deformation mechanism (not shown) that changes the shape of the pattern region PR in a plane parallel to the X-Y plane (the shape of the pattern region PR projected on the X-Y plane) by applying a force to the side surface of the mold 1.

The imprint apparatus IMP can include a measurement device 15 for measuring the height and tilt amount ($\theta X$, $\theta Y$) of the pattern region PR of the mold 1, and a measurement device 16 for measuring the height and tilt amount ($\theta X$, $\theta Y$) of the surface of the substrate 4. The measurement device 15 can be, for example, driven together with the substrate holder 5 by the substrate driver 3.

The imprint apparatus IMP can include a dispenser 20 for arranging the imprint material IM in the form of droplets on the substrate 4. The dispenser 20 may be understood as a supply device or application device that supplies the imprint material IM onto the substrate 4. The imprint apparatus IMP can include a controller 18 that controls the substrate driver 3, the mold driver 6, the curing device 30, the image capturing device 14, the measurement devices 15 and 16, the dispenser 20, and the like. The controller 18 can be configured by a PLD (Programmable Logic Device) such as an FPGA (Field Programmable Gate Array), an ASIC (Application Specific Integrated Circuit), a general-purpose or dedicated computer in which a program is installed, or a combination of all or some of them.

Figure 4:
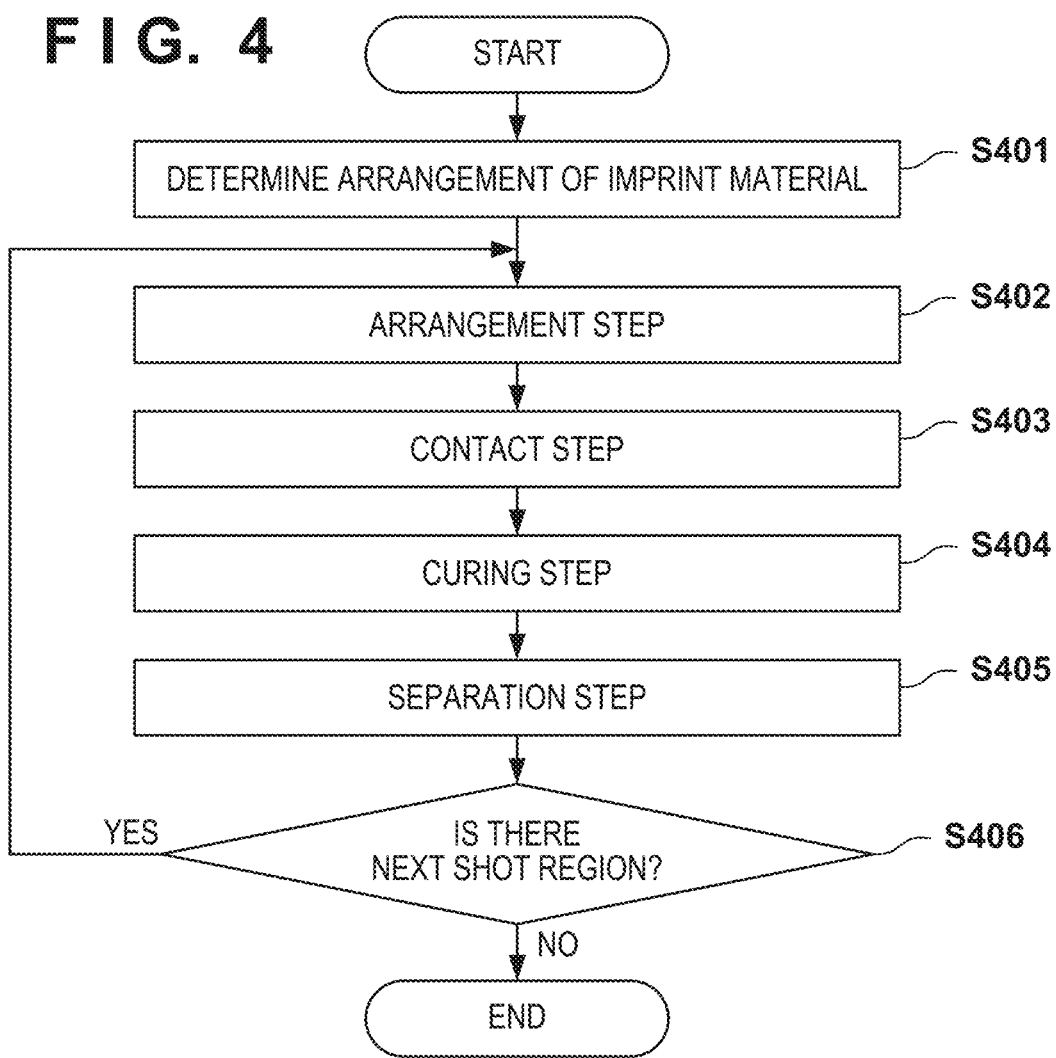
FIG. 4 is a flowchart showing an example of the operation of the imprint apparatus shown in FIGS. 1 and 2.

FIG. 4 exemplarily shows the operation of the imprint apparatus IMP. The operation shown in FIG. 4 can be controlled by the controller 18. In step S401, the controller 18 performs an arrangement determination process of determining the arrangement of the imprint material IM with respect to the shot region of the substrate 4. The arrangement determination process can include, for example, a process of generating a map (arrangement information) indicating the position of each droplet (drop) of the imprint material IM to be arranged in the shot region of the substrate 4.

In step S402, the arrangement step is performed. In the arrangement step, the controller 18 controls the dispenser 20 and the substrate driver 3 so as to arrange the imprint material IM for the shot region to be processed of the substrate 4 in accordance with the arrangement information of the imprint material IM determined in step S401. In this example, in one step S402, the imprint material IM is arranged for one shot region in which a pattern is to be formed immediately after. However, in another example, step S402 may be modified such that the imprint material IM is continuously arranged for a plurality of shot regions.

Then, in step S403, the contact step is performed. In the contact step, the imprint material IM on a part of the shot region of the substrate 4 is brought into contact with the pattern region PR of the mold 1, and then the contact region between the imprint material IM and the pattern region PR is enlarged to the whole region of the shot region. In an example, in the contact step, the controller 18 controls the deformation device 7 so as to make the mesa portion 2 and the pattern region PR convex toward the substrate 4 as illustrated in FIG. 2. Then, in this state, the controller 18 controls the mold driver 6 and/or the substrate driver 3 so as to bring the imprint material IM on a part (for example, the central portion) of the shot region of the substrate 4 into contact with a part (for example, the central portion) of the pattern region of the mold 1. After that, the controller 18 controls the mold driver 6 and/or the substrate driver 3 and the deformation device 7 so as to enlarge the contact region between the imprint material IM and the pattern region PR to the whole region of the shot region. Here, the operation for enlarging the contact region can include an operation for returning the pattern region PR to be flat by the deformation device 7 while reducing the distance between the substrate 4 and the pattern region PR of the mold 1 by the mold driver 6 and/or the substrate driver 3.

In parallel with at least a part of the contact step or after the contact step, the shot region and the pattern region PR can be aligned with each other while detecting an alignment error between the shot region of the substrate 4 and the pattern region PR of the mold 1 using an alignment detection system (not shown). While the imprint material IM and the pattern region PR are in contact with each other, the concave portion of the pattern region PR is filled with the imprint material.

After the concave portion of the pattern region PR is sufficiently filled with the imprint material, step S404 is performed. In step S404, the curing step is performed. In the curing step, the controller 18 controls the curing device 30 so as to apply curing energy to the imprint material IM between the substrate 4 and the pattern region PR. With the curing step, the imprint material IM is cured and a pattern made of a cured product of the imprint material IM is formed.

Next, step S405 is performed. In step S405, the separation step is performed. In the separation step, the controller 18 controls the mold driver 6 and/or the substrate driver 3 so as to separate the cured product of the imprint material IM from the pattern region PR of the mold 1. Then, in step S406, the controller 18 determines whether the formation of the pattern is completed for all the shot regions to form the pattern. If it is not completed, the process returns to step S402 to form the pattern in an unprocessed shot region.

Figure 5A:
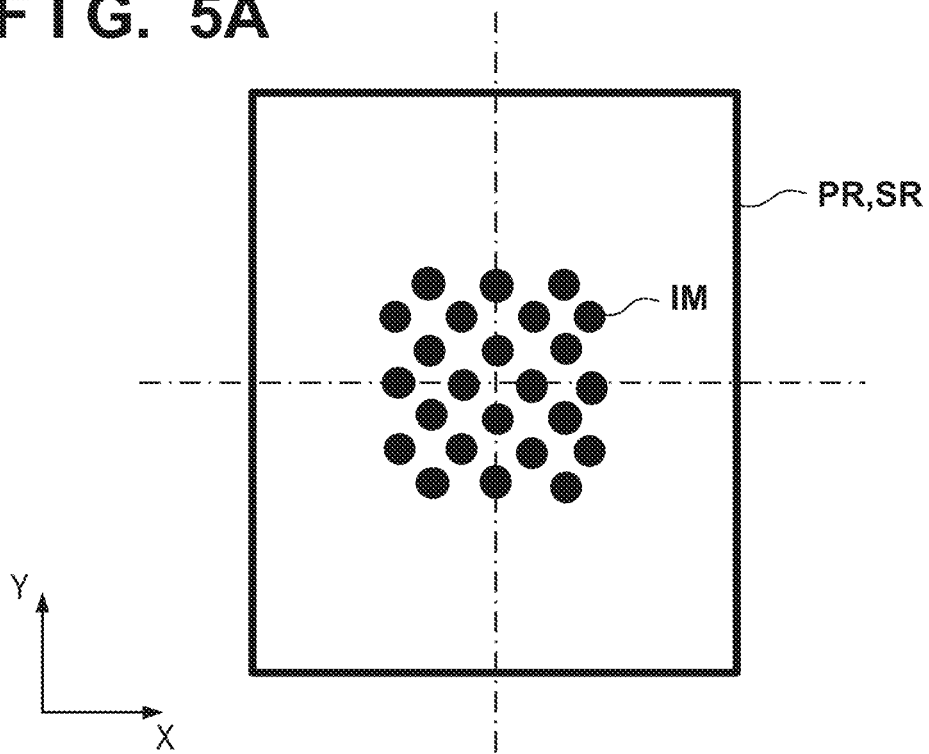
FIGS. 5A and 5B are views illustrating the arrangement of droplets of an imprint material with respect to a shot region and the droplets in a contact step.
Figure 5B:
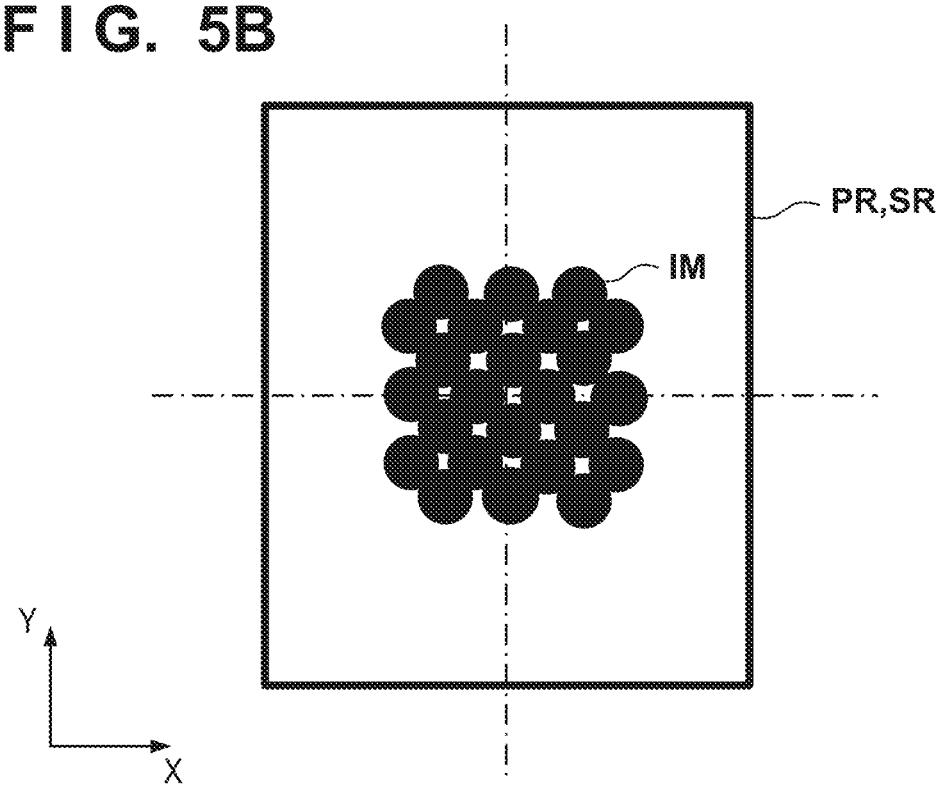

Here, with reference to FIGS. 5A and 5B, problems that can occur in the contact step will be described. In FIGS. 5A and 5B, a rectangular frame represents the pattern region PR of the mold 1 and a shot region SR of the substrate 4, and black portions represent droplets (drops) of the imprint material IM. FIG. 5A schematically shows a state before droplets of the imprint material IM on the shot region SR are brought into contact with the pattern region PR. The number of droplets may be different from the actual number. The volumes of the plurality of droplets are equal. FIG. 5B schematically shows a state in which the droplets of the imprint material IM on a part (central portion) of the shot region SR are in contact with a part (central portion) of the pattern region PR of the mold 1. The droplets of the imprint material IM in contact with the pattern region PR are crushed and spread over the shot region SR and combine with the adjacent droplets. At this time, a gas may be left in a region surrounded by a plurality of droplets of the imprint material IM, and a void (a hole in which the gas is trapped) can be generated. The smaller the void, the shorter the filling time required to fill the concave portion of the pattern region PR and the gap between the substrate 4 and the pattern region PR with the imprint material IM (that is, throughput improves).

Here, the filling time can depend on a time (referred to as a contact completion time, hereinafter) from when contact between the imprint material IM on a part of the shot region of the substrate 4 and the pattern region PR is started until when the contact region is enlarged to the whole region of the shot region. If a force pressing the pattern region PR of the mold 1 against the imprint material IM is increased to shorten the contact completion time, a pressure applied to the imprint material IM increases, resulting in an increase in pressure of a trapped gas. That is, if the contact completion time is shortened in order to improve throughput, a high-pressure gas may be trapped and a time required for the gas to be discharged increases, resulting in the degradation of throughput. Alternatively, the high-pressure gas may disable spreading of the droplets of the imprint material IM, resulting in an increase in filling time. In any case, the filling time can be influenced by various process conditions (materials, conditions controlling imprint, and the like). In the following description, it will be considered how to shorten the filling time by suppressing entrapment of the gas while shortening the contact completion time.

Figure 20A:
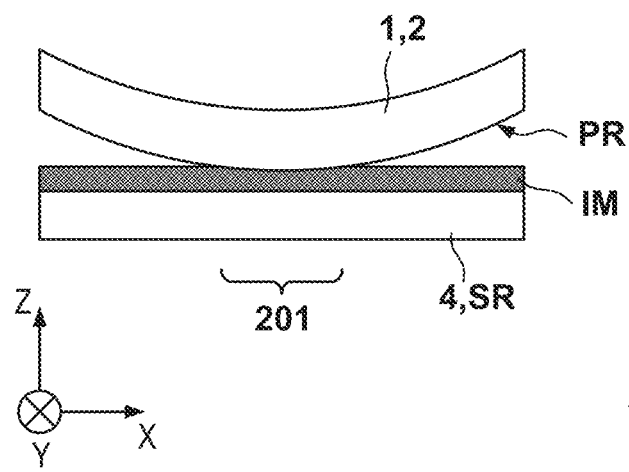
FIGS. 20A and 20B are views for explaining the enlargement of the contact region between the imprint material and the mold (pattern region thereof) in the contact step.
Figure 20B:
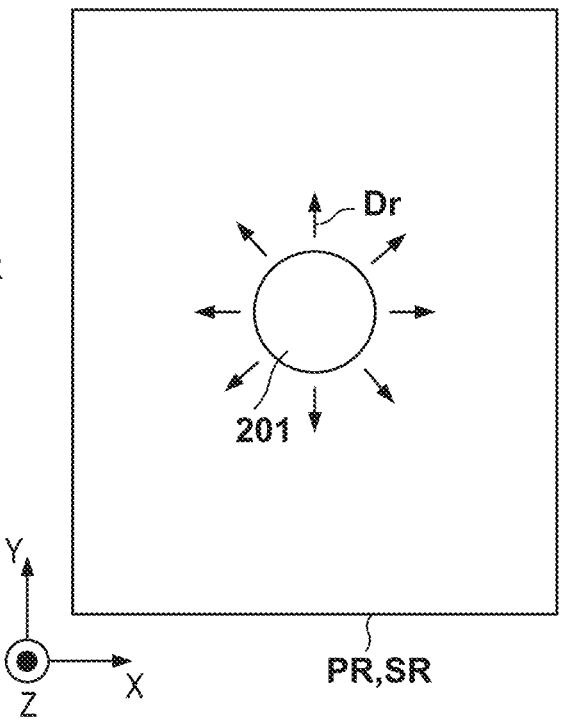
Figure 21A:
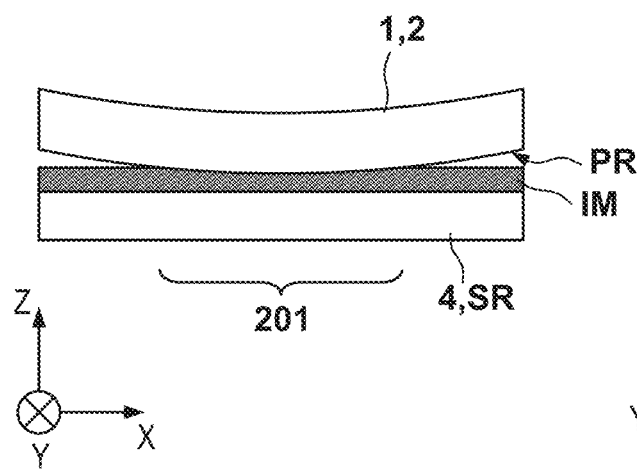
FIGS. 21A and 21B are views for explaining the enlargement of the contact region between the imprint material and the mold (pattern region thereof) in the contact step.
Figure 21B:
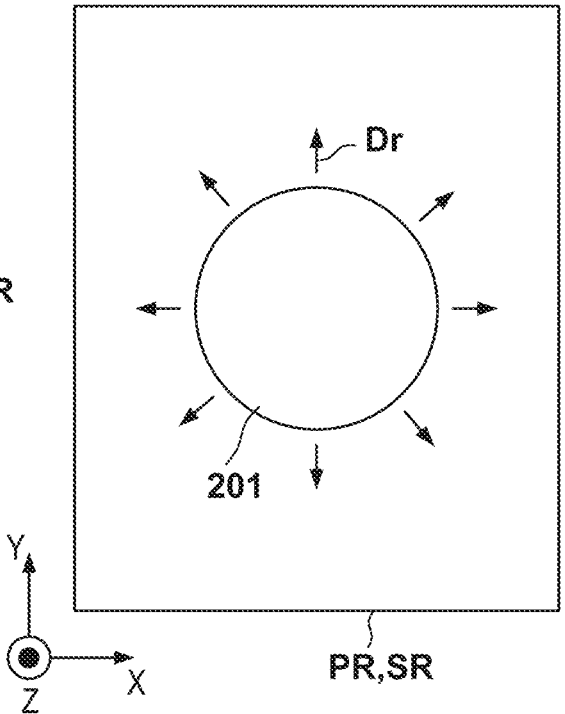

First, the enlargement of the contact region between the imprint material IM and the mold 1 (pattern region PR thereof) in the contact step will be described with reference to FIGS. 20A, 20B, 21A, and 21B. Note that in FIGS. 20A, 20B, 21A, and 21B, the imprint material IM is illustrated as not in the form of droplets but in the form of a film, for the sake of convenience. FIGS. 20A and 20B schematically show a state in which the pattern region PR of the mold 1 is deformed into a convex shape and a part (here, the central portion) of the pattern region PR is in contact with the imprint material IM on the shot region SR. The contact region between the imprint material IM and the pattern region PR is indicated by reference numeral 201. As shown in FIGS. 21A and 21B, the contact region 201 is enlarged as the contact step progresses. The contact region 201 is enlarged in a radial direction Dr from the part (central portion) where the contact between the imprint material IM and the pattern region PR is started. The radial direction Dr coincides with a direction in which the contact region 201 is enlarged.

Figure 6A:
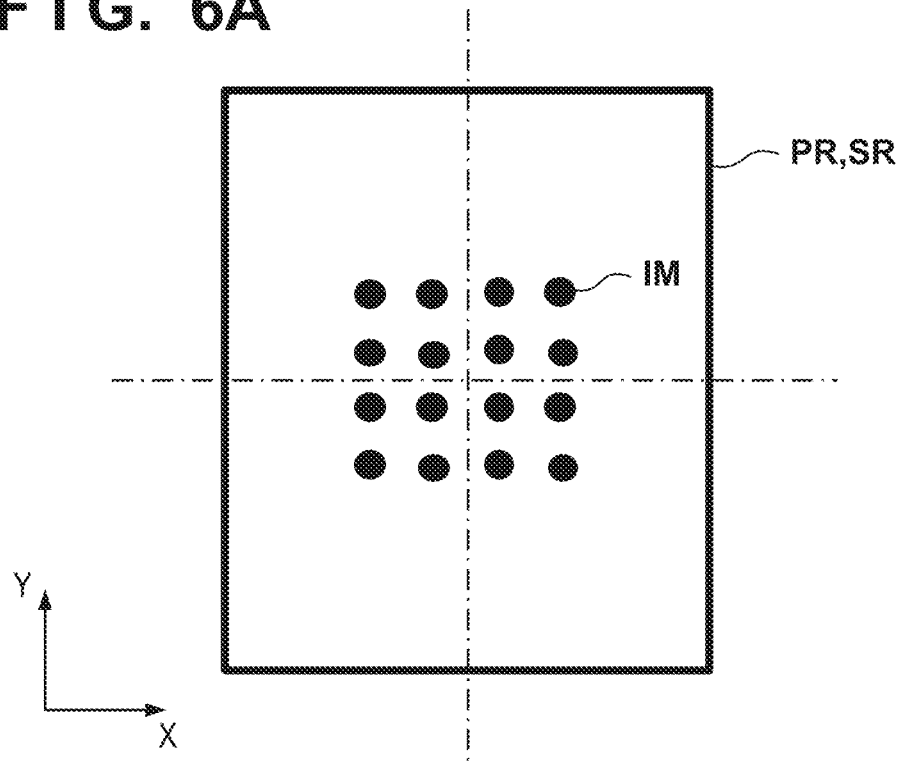
FIGS. 6A and 6B are views illustrating the arrangement of droplets of the imprint material with respect to the shot region and the droplets in the contact step.
Figure 6B:
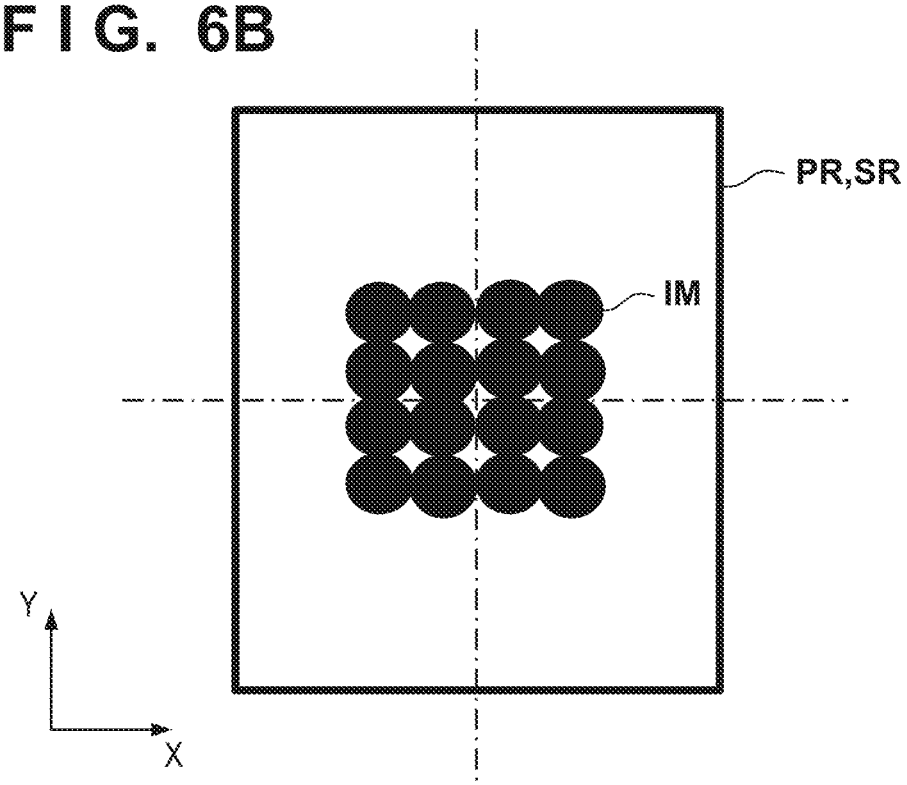

FIG. 6A shows an example in which the array pitch (center-to-center distance) of droplets of the imprint material IM in the X direction is equal to the array pitch in the Y direction, that is, droplets of the imprint material IM are arrayed in a square grid. The volumes of these droplets are all equal. FIG. 6B shows a state in which the pattern region PR is deformed into a convex shape and the central portion of the pattern region PR is brought into contact with the droplets of the imprint material IM on the shot region SR so that the droplets are spread out. Each droplet spreads evenly and adjacent droplets combine with each other so there is no gas discharge path and voids are generated. The size of the void and the pressure of the gas in the void are considered to determine the filling time.

FIG. 7A shows an example in which the ratio of the array pitch of droplets of the imprint material IM in the X direction and the array pitch in the Y direction is 1:2, that is, droplets of the imprint material IM are arranged in a staggered grid. The volumes of these droplets are all equal. FIG. 7B shows a state in which the pattern region PR is deformed into a convex shape and the central portion of the pattern region PR is brought into contact with the droplets of the imprint material IM on the shot region SR so that the droplets are spread out. Each droplet spreads evenly and adjacent droplets combine with each other so there is no gas discharge path and voids are generated. FIG. 7C shows a state before adjacent droplets combine with each other, that is, before the gas is trapped. In the state shown in FIG. 7C, there are gas discharge paths. In this state, the gas can be discharged in the radial direction Dr due to the pressure gradient which is formed in the region where the pattern region PR and the droplet are in contact with each other and in which the pressure decreases from the center of the pattern region PR in the radial directions (along arrows).

Here, consider an arbitrary local region LA1 located in the radial direction Dr from the part (central portion) where the contact between the imprint material IM and the pattern region PR is started. In the local region LA1, a directional drop density of the imprint material IM on a line parallel to a direction (X direction) orthogonal to the radial direction Dr and with a plurality of droplets of the imprint material IM present thereon is set to be A1. Further, in the local region LA1, a directional drop density of the imprint material IM on a line parallel to the radial direction Dr (Y direction) and with a plurality of droplets of the imprint material IM present thereon is set to be B1. As described above, in the example shown in FIG. 7A, since the ratio of the array pitch of droplets of the imprint material IM in the X direction and the array pitch in the Y direction is 1:2, A1:B1=1:2. This indicates that, in the local region LA1, a resistance value that disables the discharge of the gas in the radial direction Dr (Y direction) is larger than a resistance value that disables the discharge of the gas in the direction (X direction) orthogonal to the radial direction Dr.

Similarly, consider an arbitrary local region LA2 located in the radial direction Dr from the part (central portion) where the contact between the imprint material IM and the pattern region PR is started. In the local region LA2, a directional drop density of the imprint material IM on a line parallel to a direction (Y direction) orthogonal to the radial direction Dr and with a plurality of droplets of the imprint material IM present thereon is set to be A2. Further, in the local region LA2, a directional drop density of the imprint material IM on a line parallel to the radial direction Dr (X direction) and with a plurality of droplets of the imprint material IM present thereon is set to be B2. In the example shown in FIG. 7A, since the ratio of the array pitch of droplets of the imprint material IM in the X direction and the array pitch in the Y direction is 1:2, A2:B2=2:1. This indicates that, in the local region LA2, a resistance value that disables the discharge of the gas in the radial direction Dr (X direction) is smaller than a resistance value that disables the discharge of the gas in the direction (Y direction) orthogonal to the radial direction Dr.

From the above description, it can be seen that the resistance values that disable the discharge of the gas in the radial directions Dr are different between the local region LA1 and the local region LA2 in which the radial directions Dr are different. Further, it can be seen that the local region LA2 has a smaller resistance value that disables the discharge of the gas in the radial direction Dr than the local region LA1. That is, it can be seen that the arrangement of droplets of the imprint material IM shown in FIG. 7A is preferable for gas discharge in the local region LA2 but not for gas discharge in the local region LA1. From this, it can be seen that it is preferable that the local region LA1 adopts the arrangement of droplets advantageous for gas discharge in the local region LA1, and the local region LA2 adopts the arrangement of droplets advantageous for gas discharge in the local region LA2.

Figure 8A:
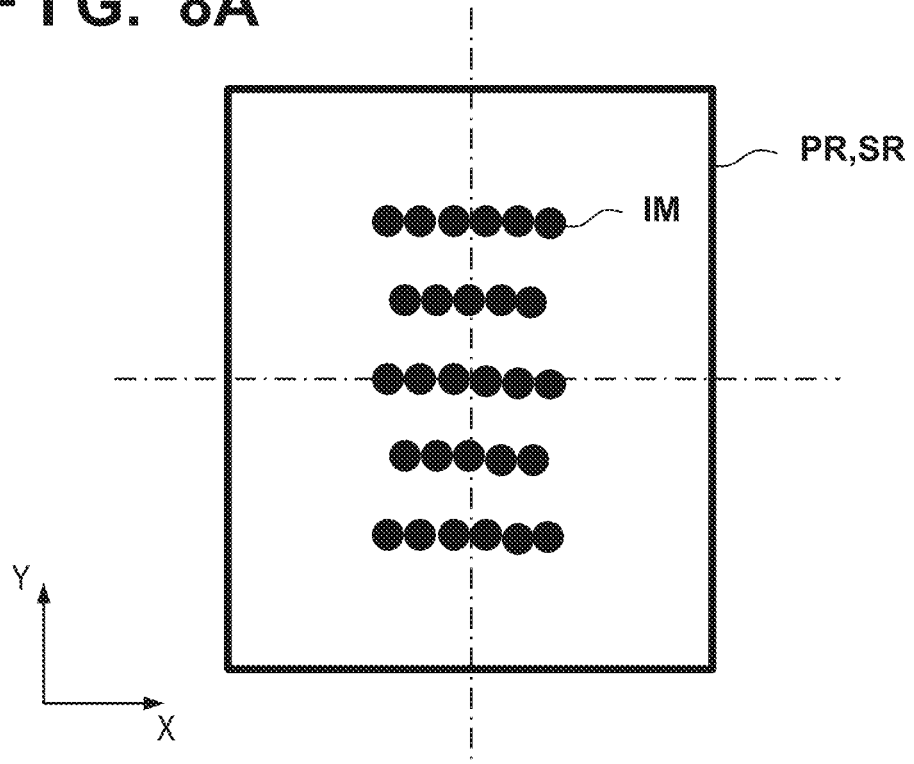
FIGS. 8A and 8B are views illustrating the arrangement of droplets of the imprint material with respect to the shot region and the droplets in the contact step.
Figure 8B:
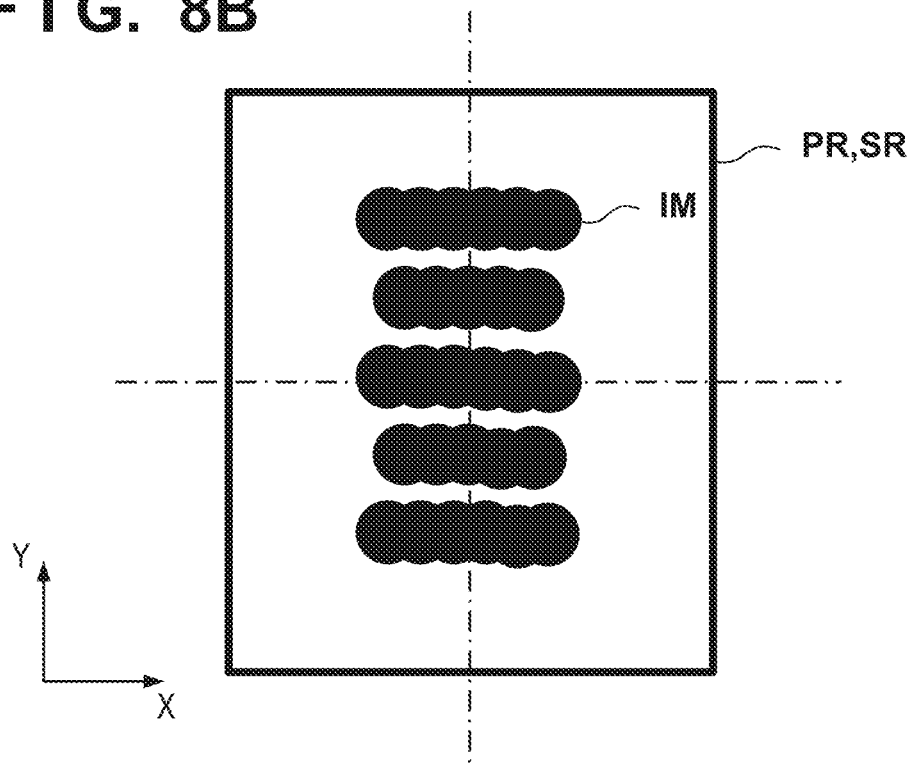

FIGS. 8A and 8B show an example that supplements the above regarding the relationship between the arrangement of droplets of the imprint material IM and the discharge of the gas. FIG. 8A shows an example in which the array pitch of droplets of the imprint material IM in the Y direction is sufficiently large. The volumes of these droplets are all equal. FIG. 8B shows a state in which the pattern region PR is deformed into a convex shape and the central portion of the pattern region PR is brought into contact with the droplets of the imprint material IM on the shot region SR so that the droplets are spread out. In the example shown in FIGS. 8A and 8B, the gas discharge path in the Y direction is closed, so that the filling time becomes long in a region in the +Y direction as viewed from the central portion and in a region in the −Y direction as viewed from the central portion.

The area of the local region should be set smaller than the area of the shot region, and it is advantageous to set the area of the local region sufficiently smaller than the area of the shot region. Then, in each local region, the arrangement of droplets of the imprint material IM can be determined such that the resistance value that disables the discharge of the gas in the radial direction Dr is smaller than the resistance value that disables the discharge of the gas in a direction orthogonal to the radial direction Dr. In an example, the area of the local region can be ¼ or less of the area of the shot region SR (the lower limit can be arbitrarily set in accordance with a calculation load for determining the arrangement of the imprint material, or the like). In another example, the area of the local region can be ¹⁄₁₀₀ or less of the area of the shot region SR (the lower limit can be arbitrarily set in accordance with a calculation load for determining the arrangement of the imprint material, or the like). It is not necessary to determine a plurality of shot regions so as to cover the whole region of the shot region SR, and it is enough to determine the local region within a region to be noted in consideration of the filling time.

Accordingly, the preferable arrangement of droplets of the imprint material IM in the shot region SR of the substrate 4 can be determined as follows in step S401. Further, in the imprint method of this embodiment, the imprint material IM can be arranged in the shot region SR in step S402 in accordance with the array determined as follows.

In step S401, first, a plurality of local regions located in the radial direction Dr from a part (e.g., the central portion) of the shot region SR, where contact between the imprint material IM and the pattern region PR is started, can be determined. Then in step S401, the arrangement of droplets of the imprint material IM can be determined so as to satisfy following condition 1 in each of the plurality of local regions.

<Condition 1> The directional drop density of the imprint material IM on a line parallel to a direction orthogonal to the radial direction Dr and with a plurality of droplets of the imprint material IM present thereon is smaller than the directional drop density of the imprint material IM on a line parallel to the radial direction Dr and with a plurality of droplets of the imprint material IM present thereon.

Alternatively, more simply, the local region may be determined so as to be in contact with the central portion of the side of the shot region SR. In this case, then in step S401, the arrangement of droplets of the imprint material IM can be determined so as to satisfy following condition 2 in each of the plurality of local regions.

<Condition 2> The directional drop density of the imprint material IM on a line parallel to the side of the shot region SR and with a plurality of droplets of the imprint material IM present thereon is smaller than the directional drop density of the imperial material IM on a line parallel to a direction orthogonal to the side and with a plurality of droplets of the imprint material IM present thereon.

Figure 11A:
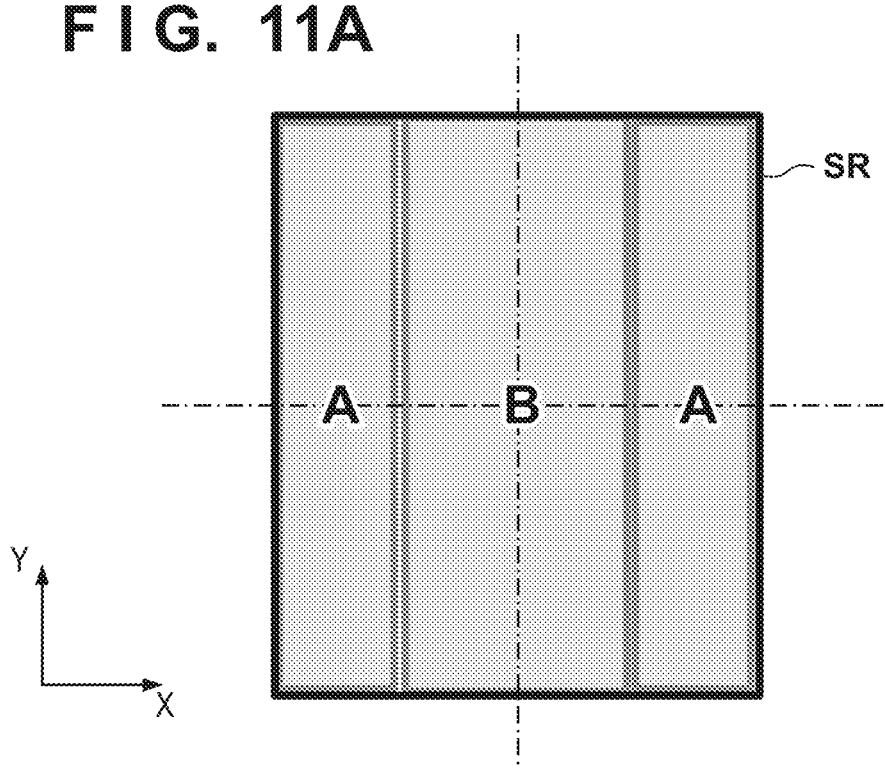
FIGS. 11A and 11B are views illustrating a method of arranging droplets of the imprint material with respect to the shot region.
Figure 11B:
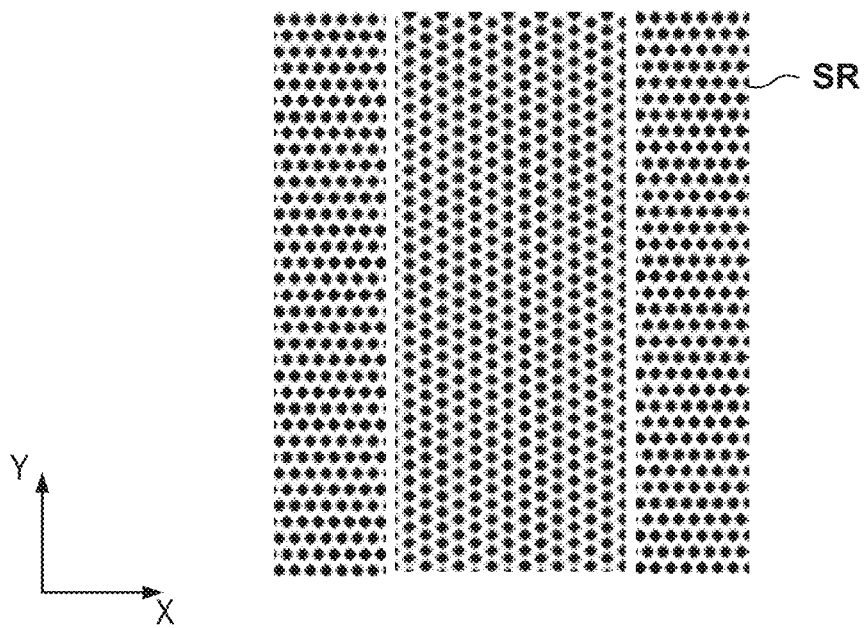

The first arrangement example of droplets of the imprint material IM according to the embodiment of the present invention will be described below with reference to FIGS. 11A and 11B. First, as illustrated in FIG. 11A, the shot region SR is divided into three regions of two regions A and one region B arranged in the X direction. Here, each of the two regions A and one region B can be considered as the above-described local region, but in this case, for example, one radial direction will be representatively determined for each of the two regions A and one region B. Alternatively, a local region may be determined in each of the two regions A, and one or a plurality of local regions may be determined in the region B. In this case, the arrangement of droplets of the imprint material IM in the region A can be determined based on the radial direction in the local region determined in the region A, and the arrangement of droplets of the imprint material IM in the region B can be determined based on the radial direction in the local region determined in the region B. That is, in this case, the radial direction in a region other than the local region in the region A is not considered, and the radial direction in a region other than the local region in the region B is not considered.

Then, for each of the two regions A and one region B, the arrangement of droplets of the imprint material IM can be determined. For example, for the region A, as illustrated in FIG. 7A or 8A, the arrangement of droplets of the imprint material IM can be determined in accordance with an array pattern in which the array pitch in the Y direction is larger than the array pitch in the X direction. With this arrangement, in the region A, the gas can be readily discharged in the X direction. For the region B, the arrangement of droplets of the imprint material IM can be determined in accordance with an array pattern in which the array pitch in the X direction is larger than the array pitch in the Y direction. With this arrangement, in the region B, the gas can be readily discharged in the Y direction. FIG. 11B illustrates the arrangement of droplets determined in this manner.

Figure 12A:
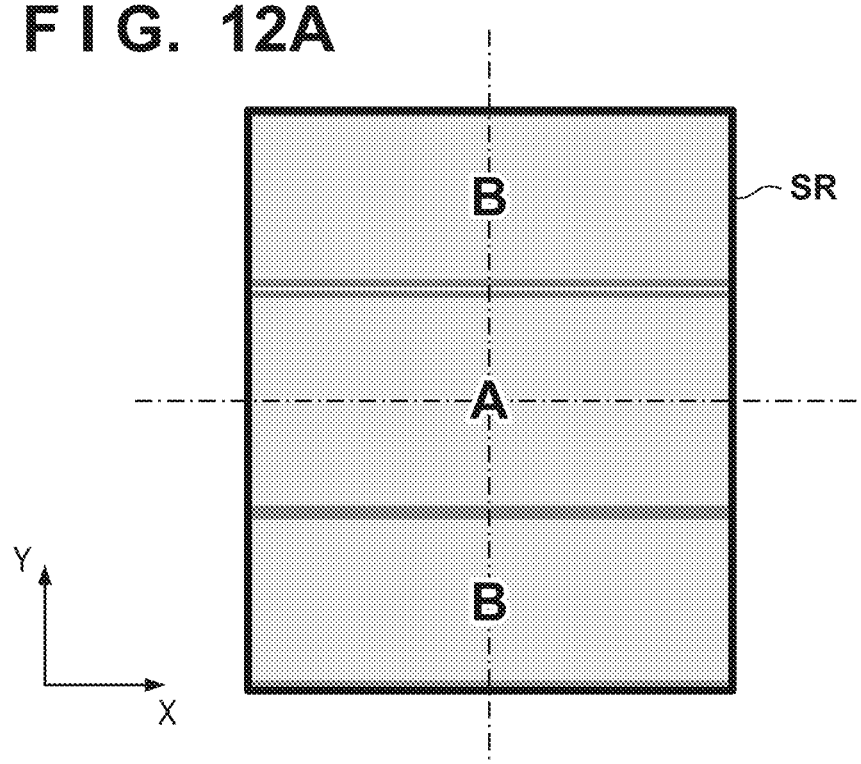
FIGS. 12A and 12B are views illustrating a method of arranging droplets of the imprint material with respect to the shot region.
Figure 12B:
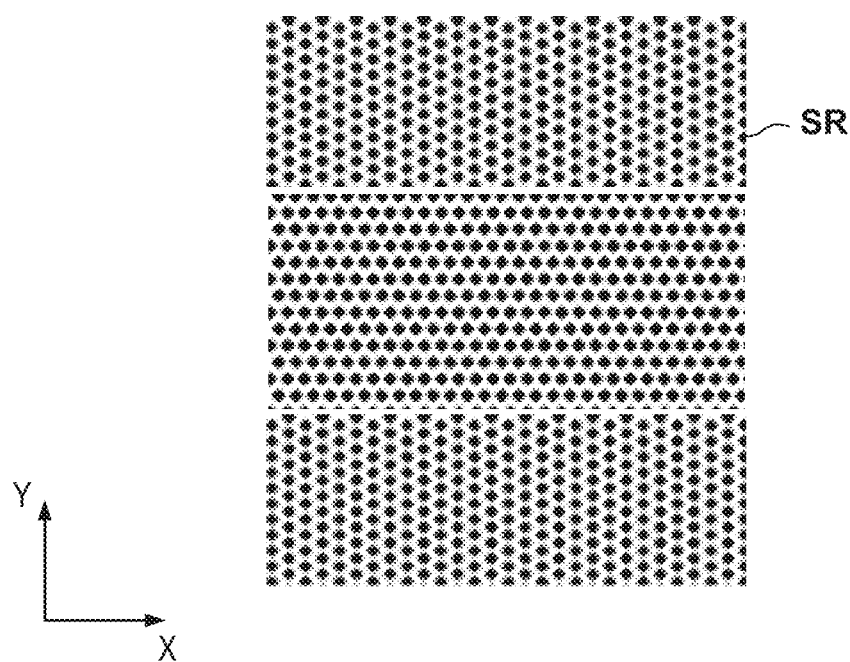

FIGS. 12A and 12B show the second arrangement example of droplets of the imprint material IM according to the embodiment of the present invention. In the second arrangement example, the shot region SR is divided into three regions of two regions B and one region A arranged in the Y direction. For the region A, the arrangement of droplets of the imprint material IM can be determined in accordance with an array pattern in which the array pitch in the Y direction is larger than the array pitch in the X direction. With this arrangement, in the region A, the gas can be readily discharged in the X direction. For the region B, the arrangement of droplets of the imprint material IM can be determined in accordance with an array pattern in which the array pitch in the X direction is larger than the array pitch in the Y direction. With this arrangement, in the region B, the gas is readily discharged in the Y direction.

Figure 13A:
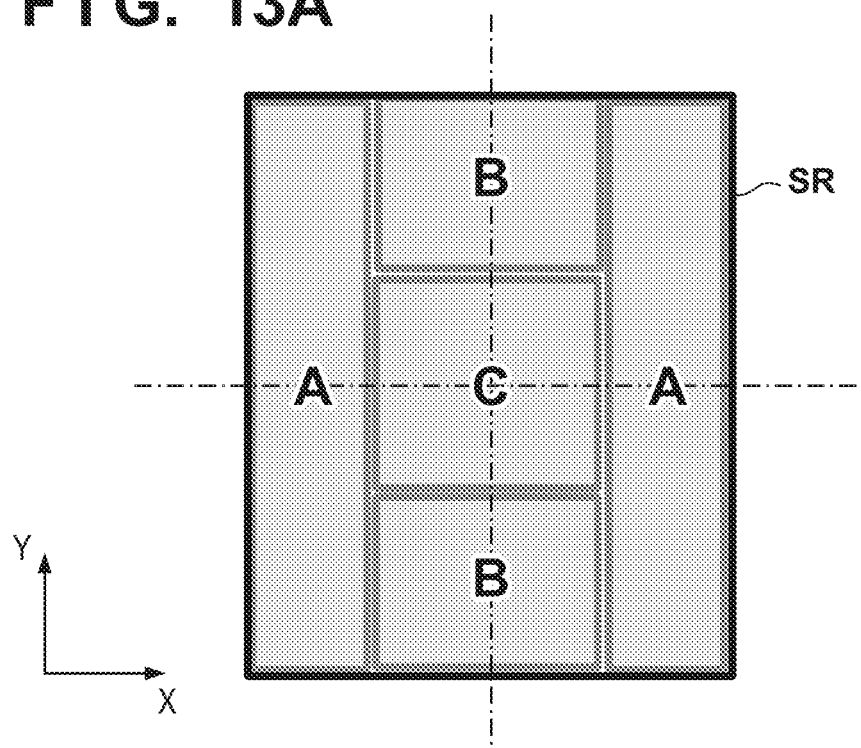
FIGS. 13A and 13B are views illustrating a method of arranging droplets of the imprint material with respect to the shot region.
Figure 13B:
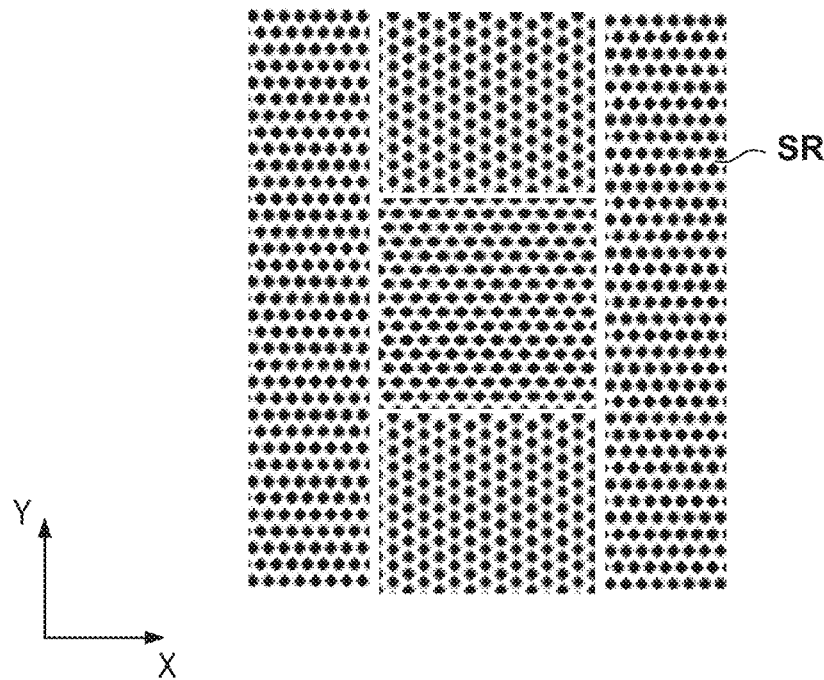

FIGS. 13A and 13B show the third arrangement example of droplets of the imprint material IM according to the embodiment of the present invention. In the third arrangement example, the shot region SR is divided into five regions of two regions A, two regions B, and one region C. The region C is located at the center of the shot region SR, and the two regions A are arranged to sandwich the region C in the X direction. The two regions B are arranged to sandwich the region C in the Y direction. In the region C, the radial direction Dr is omnidirectional. In the region C, as illustrated in FIG. 13B, droplets of the imprint material IM can be arranged in accordance with a staggered array pattern in which the ratio of the array pitch in the X direction and the array pitch in the Y direction is nearly 1:√3. It has been confirmed that such a staggered array pattern is advantageous for a region in which the radial direction Dr is omnidirectional. For the region A, the arrangement of droplets of the imprint material IM can be determined in accordance with an array pattern in which the array pitch in the Y direction is larger than the array pitch in the X direction. With this arrangement, in the region A, the gas can be readily discharged in the X direction. For the region B, the arrangement of droplets of the imprint material IM can be determined in accordance with an array pattern in which the array pitch in the X direction is larger than the array pitch in the Y direction. With this arrangement, in the region B, the gas is readily discharged in the Y direction.

Figure 14A:
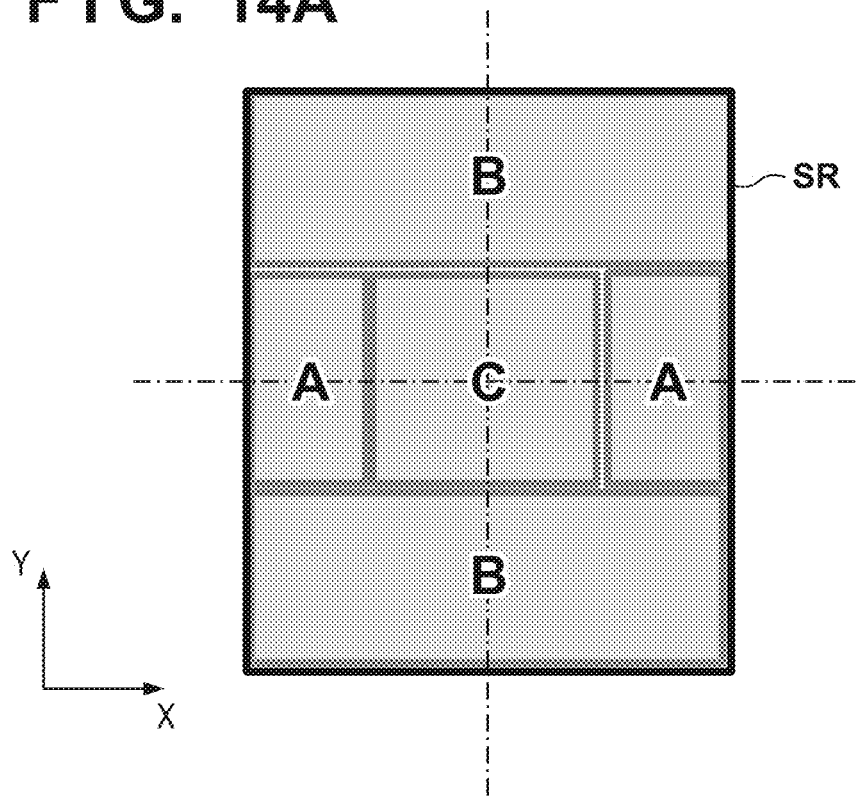
FIGS. 14A and 14B are views illustrating a method of arranging droplets of the imprint material with respect to the shot region.
Figure 14B:
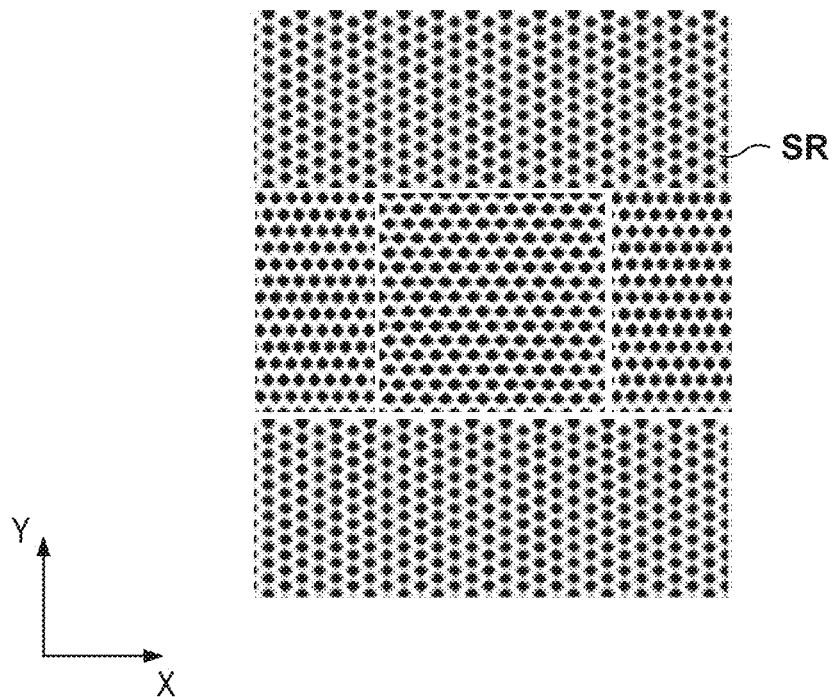

FIGS. 14A and 14B show the fourth arrangement example of droplets of the imprint material IM according to the embodiment of the present invention. The fourth arrangement example is a modification of the third arrangement example, in which the shot region SR is also divided into five regions of two regions A, two regions B, and one region C. The region C is located at the center of the shot region SR, and the two regions A are arranged to sandwich the region C in the X direction. The two regions B are arranged to sandwich the region C in the Y direction. In the region C, the radial direction Dr is omnidirectional. In the region C, as illustrated in FIG. 14B, droplets of the imprint material IM can be arranged in accordance with a staggered array pattern in which the ratio of the array pitch in the X direction and the array pitch in the Y direction is nearly 1:√3. For the region A, the arrangement of droplets of the imprint material IM can be determined in accordance with an array pattern in which the array pitch in the Y direction is larger than the array pitch in the X direction. For the region B, the arrangement of droplets of the imprint material IM can be determined in accordance with an array pattern in which the array pitch in the X direction is larger than the array pitch in the Y direction.

Figures 15A, 15B, 15C:
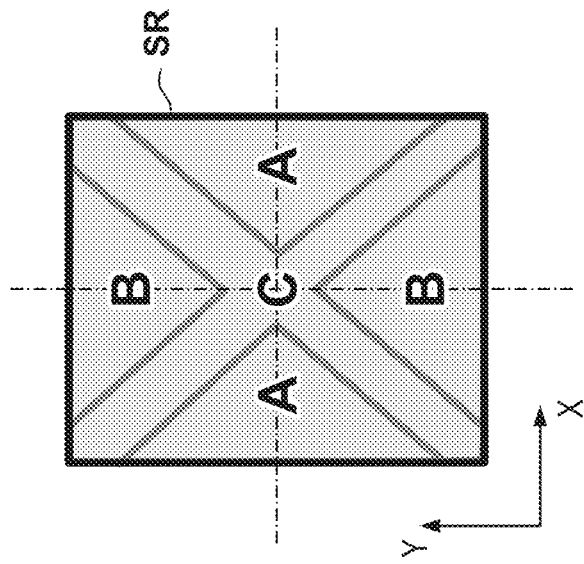
FIGS. 15A to 15C are views illustrating a method of arranging droplets of the imprint material with respect to the shot region.

FIGS. 15A to 15C are views for explaining the fifth arrangement example of droplets of the imprint material IM according to the embodiment of the present invention. In the fifth arrangement example, the shot region SR is divided by the radial direction Dr or lines parallel thereto. In the region A, the region B, and the region C, droplets of the imprint material IM can be arranged in accordance with the array patterns for the region A, the region B, and the region C described above, respectively. In addition, the radially arranged regions A and B may have drop arrangements obtained by performing a mirror inversion with respect to the X axis or the Y axis. In this case, the left and right regions A have not the same drop arrangement but rotationally symmetrical arrangements. The same applies to the regions B (not shown).

Figure 23:
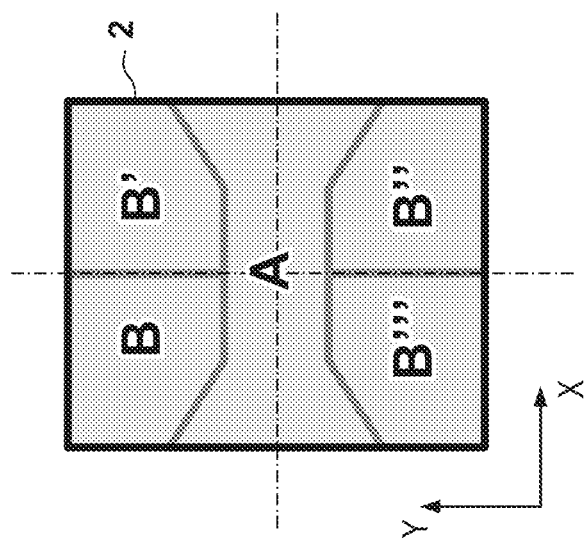
FIG. 23 is a view illustrating a method of arranging droplets of the imprint material with respect to the shot region.
Figure 24:
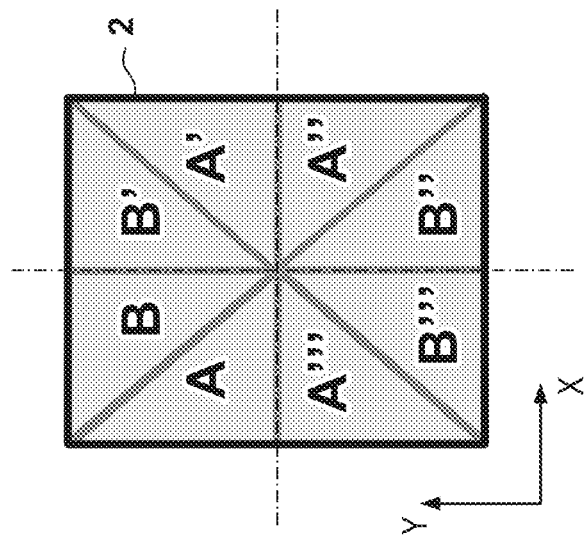
FIG. 24 is a view illustrating a method of arranging droplets of the imprint material with respect to the shot region.

FIG. 23 shows the shot region SR divided into eight regions obtained by, for example, further dividing the shot region SR shown in FIG. 15A with the radial direction lines. Each divided region has one of eight different patterns A to H. These eight different patterns may be patterns derived from the two basic patterns A and B as shown in FIG. 24, in which a pattern A' is a Y-axis mirror inverted version of the pattern A, a pattern A'' is an X-axis mirror inverted version of the pattern A', and a pattern A''' is an X-axis mirror inverted version of the pattern A. Similarly, patterns B', B'', and B''' are obtained by symmetrically inverting the pattern B. With the above method, it is easy to further increase the number of divisions along the radial direction.

Figure 25:
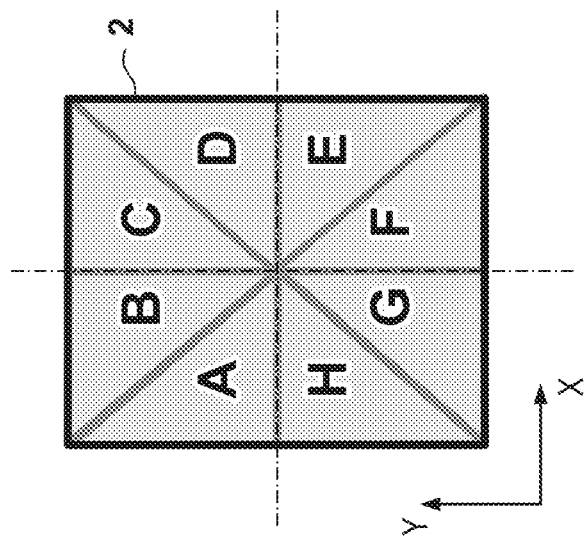
FIG. 25 is a view illustrating a method of arranging droplets of the imprint material with respect to the shot region.

Furthermore, FIG. 25 shows an example, which is a modification of FIG. 15. In this example, for example, the pattern A located at the center covers the central portion and left and right portions of the shot region SR with the same pattern using a type of pattern in which the directional drop density in a direction orthogonal to the X axis is smaller than the directional drop density in a direction parallel to the X axis, and the remaining region is covered using the pattern B. In this case, no pattern derived from the pattern A is used, but patterns derived from only the pattern B by the above method are used.

Figure 16A:
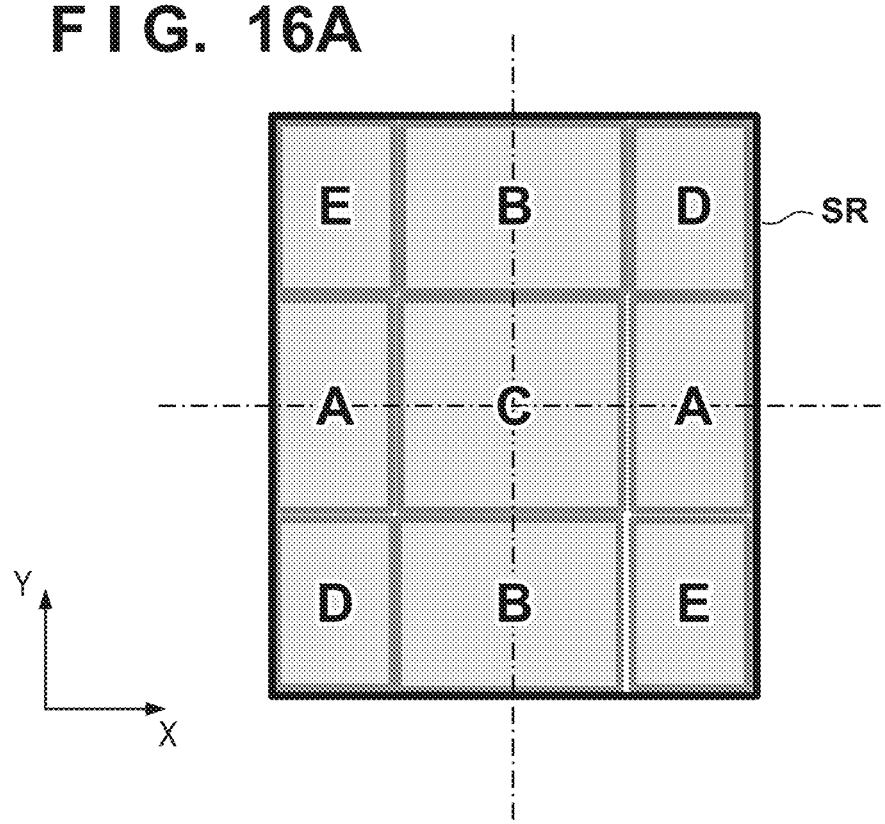
FIGS. 16A and 16B are views illustrating a method of arranging droplets of the imprint material with respect to the shot region.
Figure 16B:
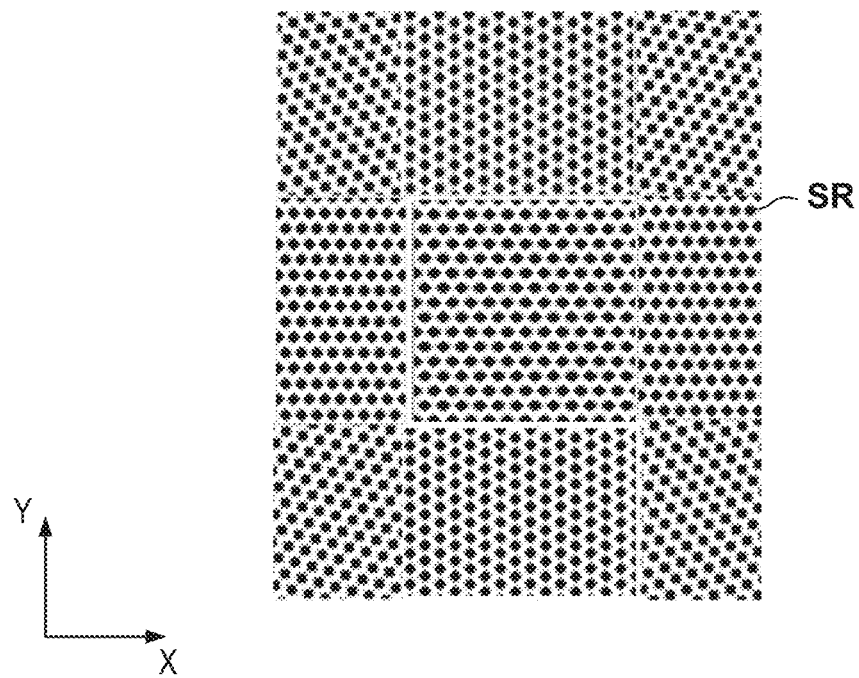

FIGS. 16A and 16B show the sixth arrangement example of droplets of the imprint material IM according to the embodiment of the present invention. In the sixth arrangement example, the shot region SR is divided into nine regions of two regions A, two regions B, one region C, two regions D, and two regions E. In the regions A, the regions B, and the region C, droplets of the imprint material IM can be arranged in accordance with the array patterns for the region A, the region B, and the region C described above, respectively. In the region D, as illustrated in FIG. 16B, for example, droplets of the imprint material IM can be arranged in accordance with an array pattern obtained by rotating the array pattern shown in FIG. 5A, 6A, 7A, or 8A by 45°. In the region E, as illustrated in FIG. 16B, for example, droplets of the imprint material IM can be arranged in accordance with an array pattern obtained by rotating the array pattern shown in FIG. 5A, 6A, 7A, or 8A by 135°.

In the manufacture of a real device, the array pattern used in the shot region may differ among, for example, the memory device region, the peripheral circuit region, and a region called a kerf corresponding to a chip boundary. However, these do not consider the radial direction Dr and the gas discharge direction.

Figure 17A:
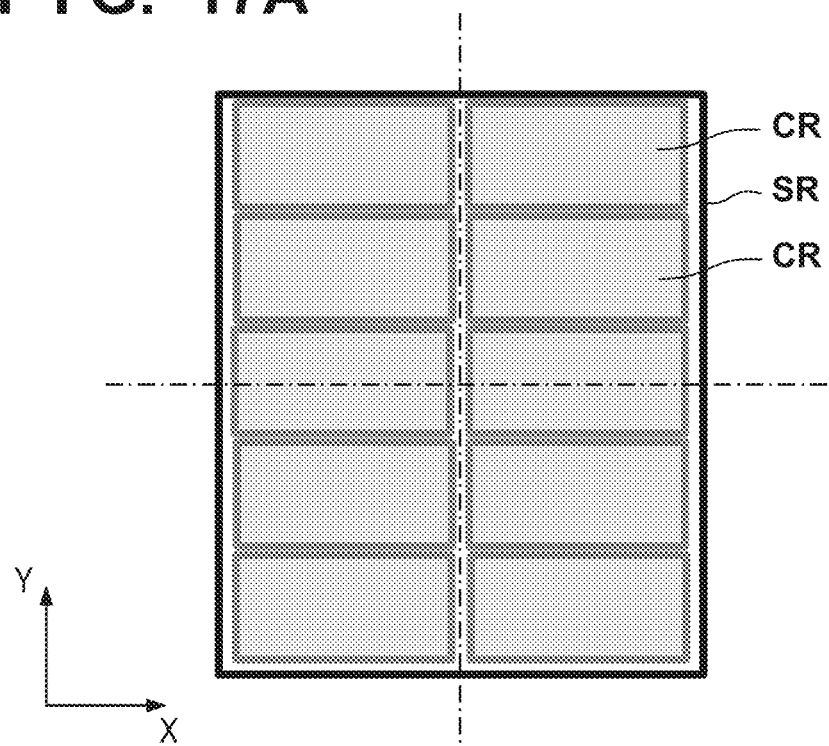
FIGS. 17A and 17B are views illustrating a method of arranging droplets of the imprint material with respect to the shot region.
Figure 17B:
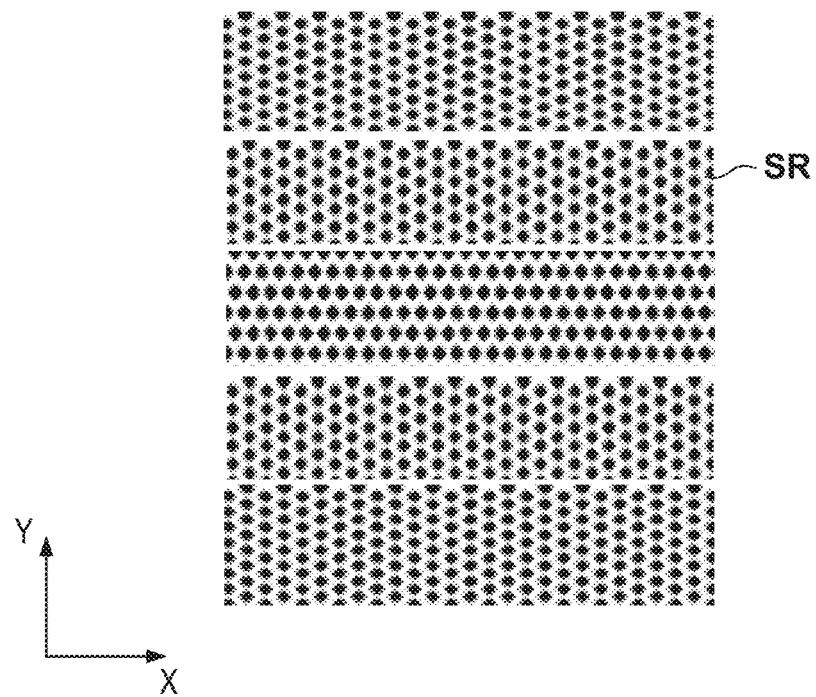

FIGS. 17A and 17B show an example in which one shot region SR includes a plurality of chip regions CR. In this case, the pattern region PR of the mold 1 includes a plurality of chip pattern regions each of which corresponds to each of the plurality of chip regions CR, and the plurality of chip pattern regions can have the same pattern. In the arrangement step (step S402), for at least two chip regions CR of the plurality of chip regions CR, droplets of the imprint material IM can be arranged in accordance with different array patterns. The at least two chip regions CR where droplets of the imprint material IM are arranged in accordance with different array patterns can include the chip region CR in contact with the central portion of the first side of the shot region SR and the chip region CR in contact with the central portion of the second side adjacent to the first side.

Figure 9A:
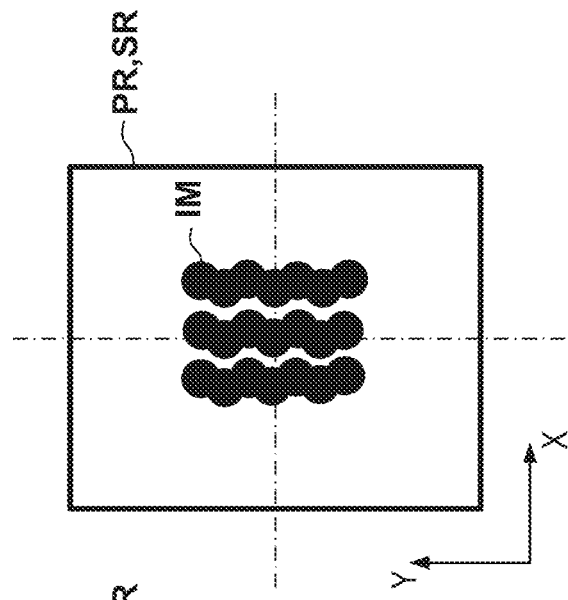
FIGS. 9A to 9C are views illustrating the arrangement of droplets of the imprint material with respect to the shot region and the droplets in the contact step.
Figure 9B:
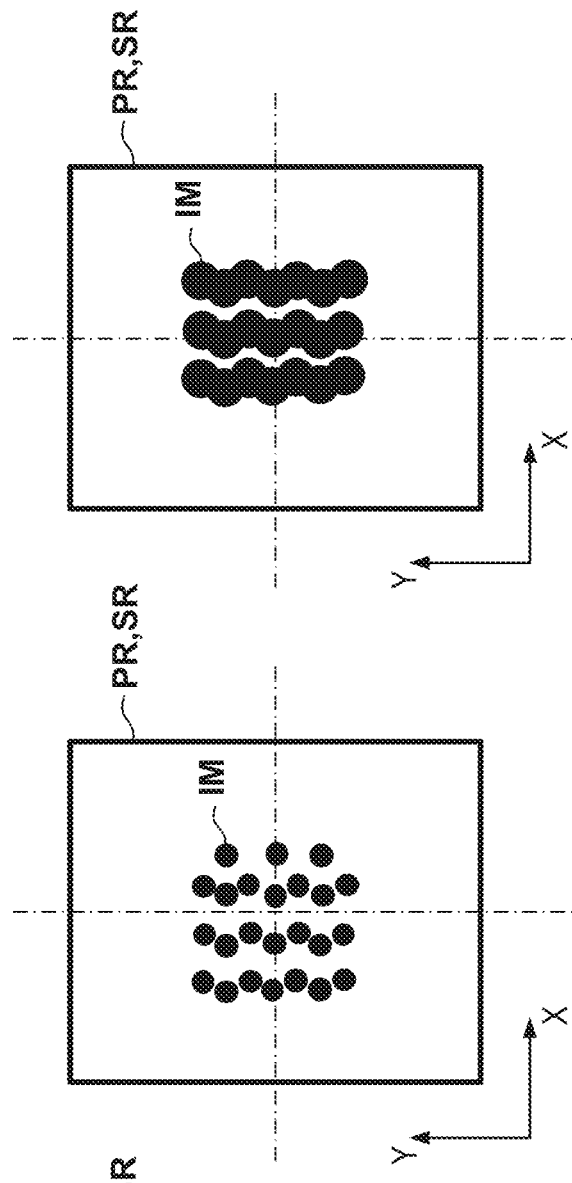
Figure 9C:
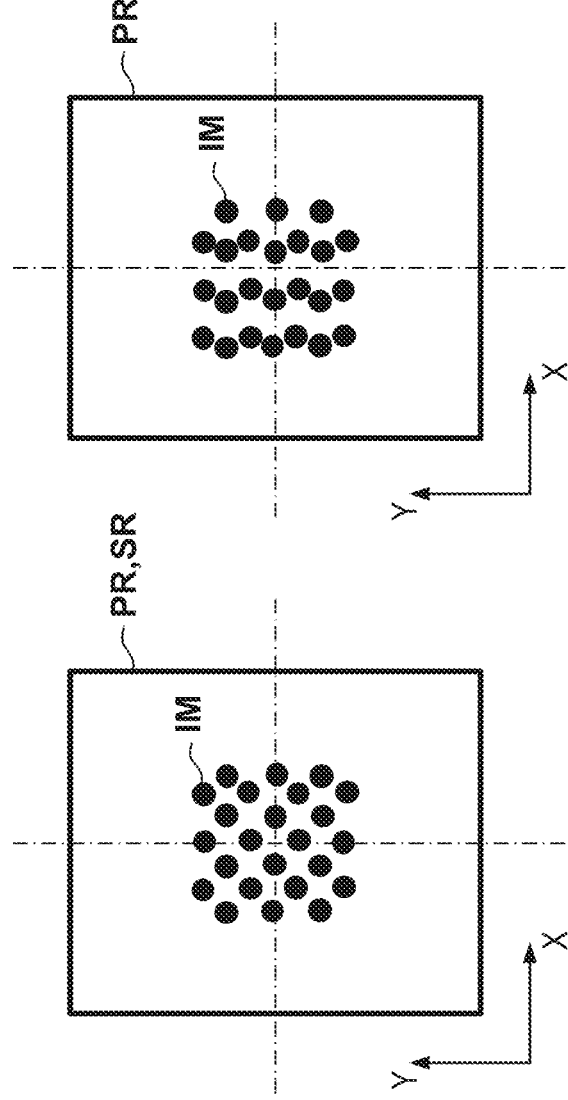

The array pattern of droplets of the imprint material may be an array pattern in which droplets are arrayed in a staggered grid, or may be an array pattern in which droplets are arrayed in a rectangular grid. Furthermore, the array pattern of droplets of the imprint material may be the following array pattern. Each of FIGS. 9A and 9B illustrates an array pattern in which an array is formed from a plurality of rows parallel to the X direction and a droplet group is shifted in the X direction by a distance less than ½ of the array pitch every other row. FIG. 9C shows a state in which droplets of the imprint material IM in accordance with the array pattern illustrated in FIG. 9B spread in the contact step.

In FIG. 9B, the gas can move in the Y direction but not in the X direction. That is, anisotropy exists in the movement direction or discharge direction of the gas. Therefore, by adjusting the amount of shift every other row and/or adjusting the direction of shift every other row, it is possible to obtain an array pattern having various directivities. In this manner, a plurality of array patterns can be obtained by preparing a basic array pattern and changing a parameter value (for example, a shift amount) defining the array pattern. In this case, since the number of droplets per unit area does not change even if the parameter value is changed, the array pattern can be adjusted without considering the volume of the imprint material.

Generally, in the manufacture of a device, the minimum thickness of the imprint material (the thickness determined by a distance between the pattern region PR and the surface of the substrate 4), which is called an RTL (Residual Layer Thickness), is specified. In general, the RTL needs to be uniform over the whole region of the shot region SR. Therefore, when changing the array pattern of the imprint material for each region within the shot region, it can be required to keep the number of droplets per unit area constant. The adjustment of the array pattern as described above is useful as a solution to such a requirement.

It is known that how the imprint material IM spreads when the imprint material IM on the substrate 4 is brought into contact with the pattern region PR of the mold 1 depends on the pattern of the pattern region PR. The step of the pattern of the pattern region PR, that is, the depth of the concave portion forming the pattern is, for example, about twice the pattern size. In addition, there are various types of patterns, such as a line and space pattern, an isolated line pattern, a pillar pattern, an inspection mark pattern, and the like. For example, if a line and space pattern is used, the smaller the pattern size, the more the surface area per unit volume, and the capillary force also increases in proportion to the surface area. As a result, the imprint material IM readily spreads longer in the longitudinal direction of the line, but it does not readily spread in the widthwise direction of the line.

Figures 10A, 10B, 10C:
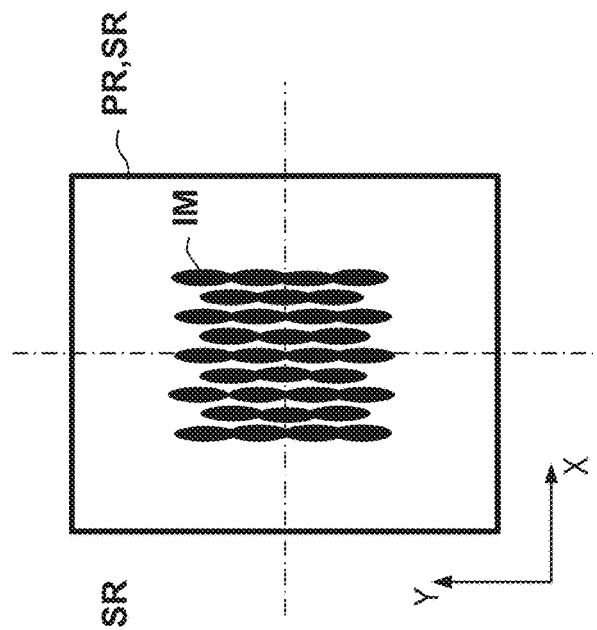
FIGS. 10A to 10C are views illustrating the arrangement of droplets of the imprint material with respect to the shot region and the droplets in the contact step.

A typical spread example of droplets of the imprint material IM will be described with reference to FIGS. 10A to 10C. FIG. 10A shows droplets of the imprint material IM arranged in a staggered grid on the substrate 4. FIG. 10B shows droplets of the imprint material IM spread by contacting with the pattern region PR having a line and space pattern extending in the X direction. In the example shown in FIG. 10B, the gas is discharged in the X direction, but not in the Y direction. FIG. 10C shows droplets of the imprint material IM spread by contacting with the pattern region PR having a line and space pattern extending in the Y direction. In the example shown FIG. 10C, the gas is discharged in the Y direction, but not in the X direction.

Figure 18:
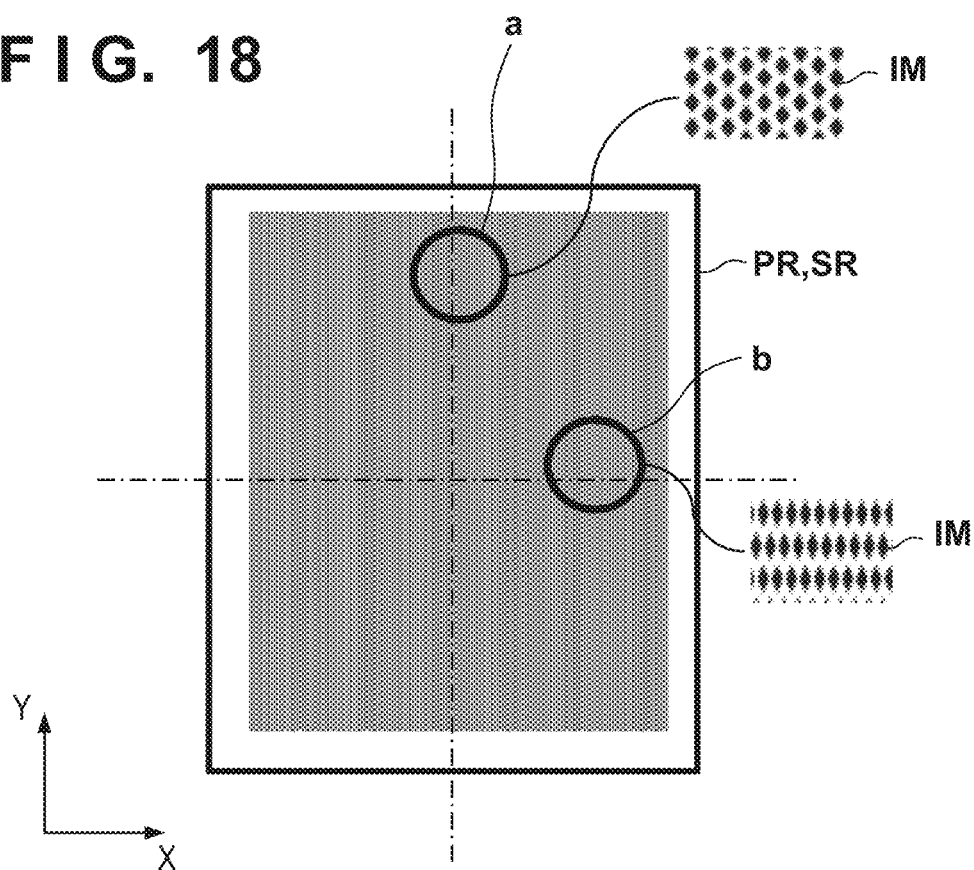
FIG. 18 is a view illustrating a method of arranging droplets of the imprint material with respect to the shot region.

FIG. 18 shows an arrangement example of droplets of the imprint material IM upon forming a pattern in the shot region SR using the mold 1 including the pattern region PR having a line and space pattern extending in the Y direction in the whole region of the pattern region PR. Conventionally, droplets of the imprint material IM are arranged in accordance with the same array pattern both in a region a located in the Y direction of the central portion of the shot region SR where contact between the imprint material IM and the pattern region PR is started and in a region b located in the X direction of the central portion.

In this embodiment, droplets of the imprint material IM are arranged in accordance with different array patterns for the regions a and b. In the region a, the directional drop density of the imprint material on a line parallel to a direction (X direction) orthogonal to the radial direction (Y direction) and with a plurality of droplets of the imprint material present thereon is smaller than the directional drop density of the imprint material on a line parallel to the radial direction and with a plurality of droplets of the imprint material present thereon. In the region b, the directional drop density of the imprint material on a line parallel to a direction (Y direction) orthogonal to the radial direction (X direction) and with a plurality of droplets of the imprint material present thereon is smaller than the directional drop density of the imprint material on a line parallel to the radial direction and with a plurality of droplets of the imprint material present thereon.

It has been described above assuming that the volumes of a plurality of droplets of the imprint material IM arranged in the shot region are equal, but the above-described directional drop density may be adjusted by adjusting the volumes of individual droplets. In this case, the array pattern of droplets can be changed along with the adjustment of the volumes of individual droplets so as to satisfy the requirement for the RTL.

Figure 19:
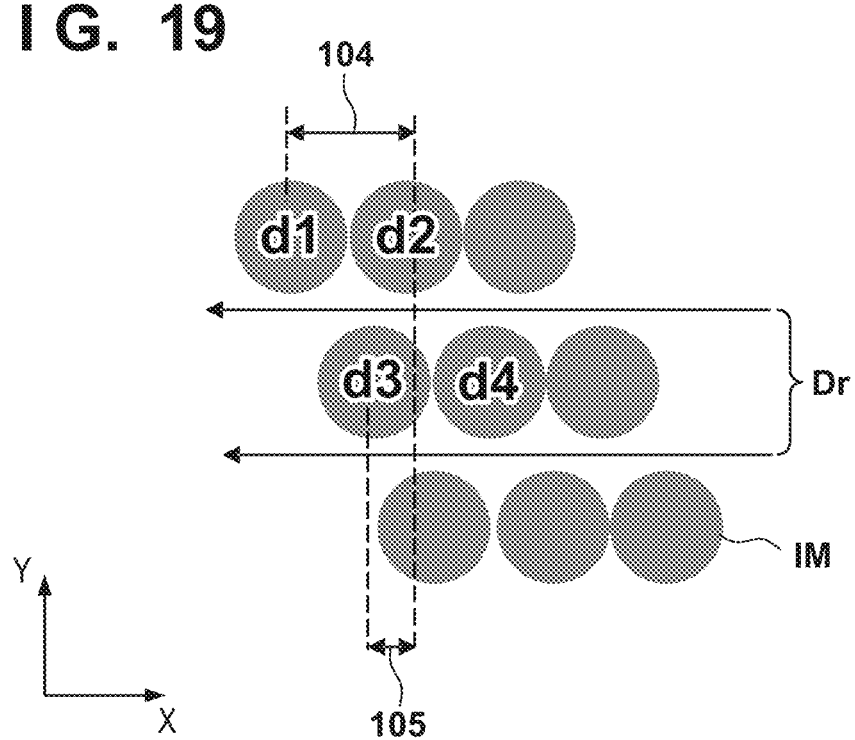
FIG. 19 is a view for explaining indices for evaluating the arrangement of droplets of the imprint material.

With reference to FIG. 19, indices for evaluating the arrangement of droplets of the imprint material IM will be described below. FIG. 19 shows a local region in the shot region SR, in which a gray circle represents a droplet of the imprint material IM. Some droplets are shown as droplets d1, d2, d3, and d4 in order to distinguish them from one another. The radial direction Dr is the −X direction. The smaller the directional drop density of the imprint material IM on a line parallel to a direction (Y direction) orthogonal to the radial direction Dr (−X direction), the more readily the gas is discharged. Accordingly, the directional drop density can be used as the index of evaluation. The smaller a distance 104 between the droplet d1 and the droplet d2 in a direction parallel to the radial direction Dr, the more readily the droplets d1 and the droplet d2 combine with each other, so that the gas discharge path can be more easily limited to the radial direction Dr. Accordingly, the smaller the distance 104 between the droplet d1 and the droplet d2 in the direction parallel to the radial direction Dr, the shorter the filling time can be. However, if the distance 104 is too small, the distance between the droplets in a direction orthogonal to the radial direction Dr becomes too large, so that the filling time can become long. Accordingly, the distance 104 can be used as the index of evaluation. Further, a positional deviation 105 between the droplet d2 and the droplet d3 in the radial direction Dr influences the size of a void formed when the droplets d2 and the droplet d3 combine with each other. When the positional deviation 105 is about ½ of the array pitch of droplets in the radial direction Dr, the void can be the smallest and the filling time can be short. Accordingly, the positional deviation 105 can also be used as the index of evaluation. Optimization of the array of droplets can be made based on the above three indices.

The pattern of a cured product formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, an SRAM, a flash memory, and an MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Figure 22A:
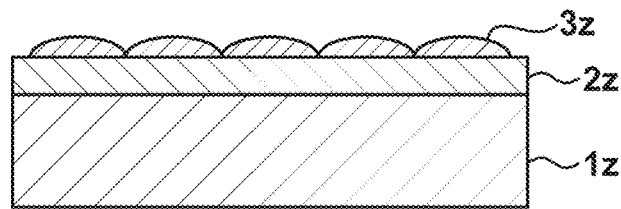
FIGS. 22A to 22F are views illustrating an article manufacturing method.

An article manufacturing method will be described next, in which a pattern is formed on a substrate by an imprint apparatus or an imprint method, the substrate with the pattern formed thereon is processed, and an article is manufactured from the processed substrate. As shown in FIG. 22A, a substrate 1z such as a silicon wafer with a processed material 2z such as an insulator formed on the surface is prepared. Next, an imprint material 3z is applied to the surface of the processed material 2z by an inkjet method or the like. A state in which the imprint material 3z is applied as a plurality of droplets onto the substrate is shown here.

Figure 22B:
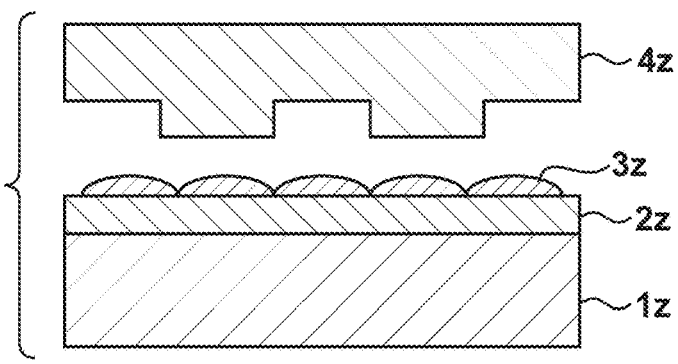
Figure 22C:
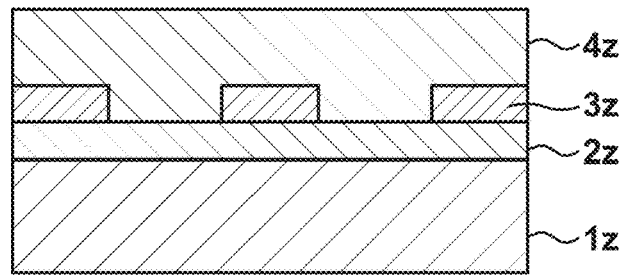

As shown in FIG. 22B, a side of a mold 4z for imprint with an uneven pattern is directed to and caused to face the imprint material 3z on the substrate. As shown in FIG. 22C, the substrate 1z to which the imprint material 3z is applied is brought into contact with the mold 4z, and a pressure is applied. The gap between the mold 4z and the processed material 2z is filled with the imprint material 3z. In this state, when the imprint material 3z is irradiated with light serving as energy for curing via the mold 4z, the imprint material 3z is cured.

Figure 22D:
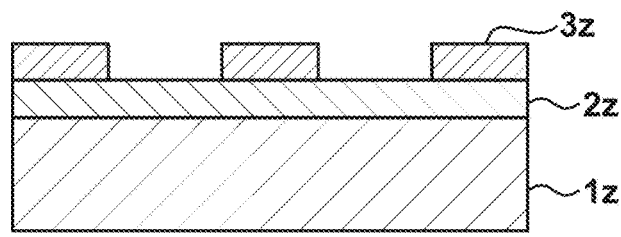

As shown in FIG. 22D, after the imprint material 3z is cured, the mold 4z is separated from the substrate 1z. Then, the pattern of the cured product of the imprint material 3z is formed on the substrate 1z. In the pattern of the cured product, the concave portion of the mold corresponds to the convex portion of the cured product, and the convex portion of the mold corresponds to the concave portion of the cured product. That is, the uneven pattern of the mold 4z is transferred to the imprint material 3z.

Figure 22E:
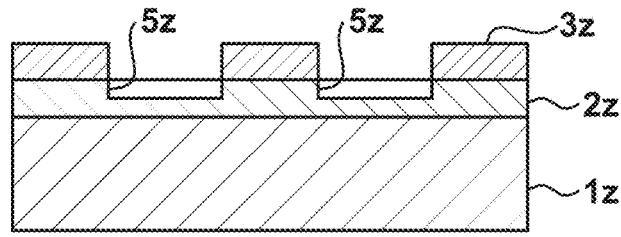
Figure 22F:
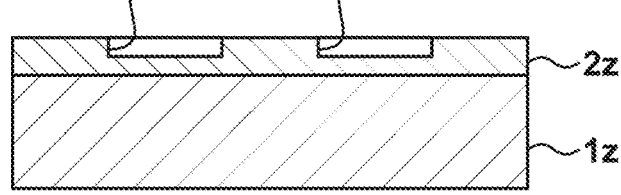

As shown in FIG. 22E, when etching is performed using the pattern of the cured product as an etching resistant mask, a portion of the surface of the processed material 2z where the cured product does not exist or remains thin is removed to form a groove 5z. As shown in FIG. 22F, when the pattern of the cured product is removed, an article with the grooves 5z formed in the surface of the processed material 2z can be obtained. Here, the pattern of the cured product is removed. However, instead of processing or removing the pattern of the cured product, it may be used as, for example, an interlayer dielectric film included in a semiconductor element or the like, that is, a constituent member of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2018-169118, filed Sep. 10, 2018, and No. 2019-156738, filed Aug. 29, 2019, which are hereby incorporated by reference herein in their entirety.

What is claimed is:

1. An imprint method comprising arranging an imprint material in a form of droplets on a shot region of a substrate, bringing the imprint material on a central portion of the shot region into contact with a pattern region of a mold and then enlarging a contact region between the imprint material and the pattern region to a whole region of the shot region, and curing the imprint material after the bringing,
wherein in the arranging, in each of a plurality of local regions located in a radial direction from the central portion of the shot region, the imprint material is arranged such that a directional drop density of the imprint material on a line parallel to a direction orthogonal to the radial direction and with a plurality of droplets of the imprint material present thereon is smaller than a directional drop density of the imprint material on a line parallel to the radial direction and with a plurality of droplets of the imprint material present thereon,
wherein the plurality of local regions includes a first local region located in a first radial direction from the central portion of the shot region and a second local region located in a second radial direction from the central portion of the shot region, and
wherein the first radial direction and the second radial direction intersect.

2. The method according to claim 1, wherein the first local region is in contact with a central portion of a first side of the shot region,
wherein the second local region is in contact with a central portion of a second side of the shot region, and
wherein the first side of the shot region and the second side of the shot region intersect.

3. The method according to claim 1, wherein
the plurality of local regions include at least two local regions onto which a same pattern is transferred using the mold, and
in the arranging, for the at least two local regions, droplets of the imprint material are arranged in accordance with different array patterns.

4. The method according to claim 3, wherein in the arranging, the imprint material is arranged in the at least two local regions in equal volumes.

5. An imprint method comprising:
arranging an imprint material in a form of droplets on a shot region of a substrate, bringing the imprint material on a central portion of the shot region into contact with a pattern region of a mold before enlarging a contact region between the imprint material and the pattern region to a whole region of the shot region, and curing the imprint material after the bringing,
wherein in the arranging, in a local region in contact with a central portion of a side of the shot region, the imprint material is arranged such that a directional drop density of the imprint material on a line parallel to the side and with a plurality of droplets of the imprint material present thereon is smaller than a directional drop density of the imprint material on a line parallel to a direction orthogonal to the side and with a plurality of droplets of the imprint material present thereon,
wherein the local region includes a first local region in contact with the central portion of a first side of the shot region and a second local region in contact with the central portion of a second side of the shot region, and
wherein the first side of the shot region and the second side of the shot region intersect.

6. The method according to claim 1, wherein an area of the local region is not more than ¼ of an area of the shot region.

7. The method according to claim 5, wherein an area of the local region is not more than ¼ of an area of the shot region.

8. The method according to claim 1, wherein an area of the local region is not more than ¹⁄₁₀₀ of an area of the shot region.

9. The method according to claim 5, wherein an area of the local region is not more than 1/100 of an area of the shot region.

10. The method according to claim 1, wherein
the shot region includes a plurality of chip regions, the pattern region includes a plurality of chip pattern regions each of which corresponds to each of the plurality of chip regions, and the plurality of chip pattern regions have the same pattern, and
in the arranging, for at least two chip regions of the plurality of chip regions, droplets of the imprint material are arranged in accordance with different array patterns.

11. The method according to claim 5, wherein
the shot region includes a plurality of chip regions, the pattern region includes a plurality of chip pattern regions each of which corresponds to each of the plurality of chip regions, and the plurality of chip pattern regions have the same pattern, and
in the arranging, for at least two chip regions of the plurality of chip regions, droplets of the imprint material are arranged in accordance with different array patterns.

12. The method according to claim 10, wherein the at least two chip regions include a chip region in contact with a central portion of a first side of the shot region and a chip region in contact with a central portion of a second side adjacent to the first side.

13. The method according to claim 11, wherein the at least two chip regions include a chip region in contact with a central portion of a first side of the shot region and a chip region in contact with a central portion of a second side adjacent to the first side.

14. The method according to claim 1, wherein in the arranging, a plurality of droplets of the imprint material are arranged in a rectangular grid.

15. The method according to claim 5, wherein in the arranging, a plurality of droplets of the imprint material are arranged in a rectangular grid.

16. The method according to claim 1, wherein in the arranging, a plurality of droplets of the imprint material are arranged in a staggered grid.

17. The method according to claim 5, wherein in the arranging, a plurality of droplets of the imprint material are arranged in a staggered grid.

18. The method according to claim 1, wherein in the bringing, contact between the imprint material and the pattern region is started in a state in which the mold is deformed into a convex portion toward the substrate.

19. The method according to claim 5, wherein in the bringing, contact between the imprint material and the pattern region is started in a state in which the mold is deformed into a convex portion toward the substrate.

20. An article manufacturing method comprising:
forming a pattern on a substrate in accordance with an imprint method cited in claim 1; and
obtaining an article by processing the substrate with the pattern formed.

21. An article manufacturing method comprising:
forming a pattern on a substrate in accordance with an imprint method cited in claim 5; and
obtaining an article by processing the substrate with the pattern formed.

* * * * *